United States Patent
Ando et al.

[11] Patent Number: 5,843,603
[45] Date of Patent: Dec. 1, 1998

[54] METHOD OF EVALUATING SHAPED BEAM OF CHARGED BEAM WRITER AND METHOD OF FORMING PATTERN

[75] Inventors: Atsushi Ando, Tokyo-to; Hitoshi Sunaoshi, Yokohama; Hirotsugu Wada, Tokyo-to; Kazuyoshi Sugihara, Yokosuka, all of Japan

[73] Assignee: Kabushiki Kaisha Toshiba, Kawasaki, Japan

[21] Appl. No.: 701,614

[22] Filed: Aug. 22, 1996

[30] Foreign Application Priority Data

Aug. 25, 1995 [JP] Japan .................................... 7-217847
Aug. 25, 1995 [JP] Japan .................................... 7-217940

[51] Int. Cl.[6] ................................ G03F 9/00; G03F 7/20
[52] U.S. Cl. ........................... 430/30; 430/296; 430/942; 250/492.22; 250/396 R; 250/398
[58] Field of Search ............................... 430/22, 30, 296, 430/942; 250/492.22, 396 R, 398

[56] References Cited

U.S. PATENT DOCUMENTS 4,543,512  9/1985  Nakasuji et al. ................... 315/382
5,391,886  2/1995  Yamada et al. .................. 250/492.22

FOREIGN PATENT DOCUMENTS 59-135728  8/1984  Japan .

*Primary Examiner*—Christopher G. Young
*Attorney, Agent, or Firm*—Foley & Lardner

[57] ABSTRACT

A method of evaluating a shaped beam generated by a charged beam writer, comprises the steps of: a first step of shaping line beams by dividing into 1/n one side of the shaped beam having a dimension "a" in an x direction and a dimension "b" in a y direction perpendicular to the x direction, where n is the number of divisions; a second step of irradiating the shaped line beam upon a surface of the sample or the movable stage for a constant time or longer; a third step of shaping a beam by adding a bias value δ to each line beam width in the divided direction; a fourth step of irradiating the line beam obtained by adding the bias value to the shaped line beam upon a photosensitive substance on the sample surface for a constant time for exposure; a fifth step of repeating the fourth step exposure (n−1) times by shifting the line beam obtained by adding the bias value to the line beam, in the direction that one side of the shaped beam is divided into 1/n, and developing the photosensitive substance, to obtain a pattern width θ; a sixth step of repeating the above first to fifth steps by changing the number of divisions n and the bias value δ; and a seventh step of obtaining a change rate Δθ/Δn of the pattern width θ relative to the number of divisions n for each bias value δ, to obtain an offset drift rate on the basis of the obtained change rate and the bias value. The method can evaluate a beam offset drift rate between the set beam dimension and the actual beam dimension, so that a microscopic pattern can be formed at a high precision.

8 Claims, 23 Drawing Sheets

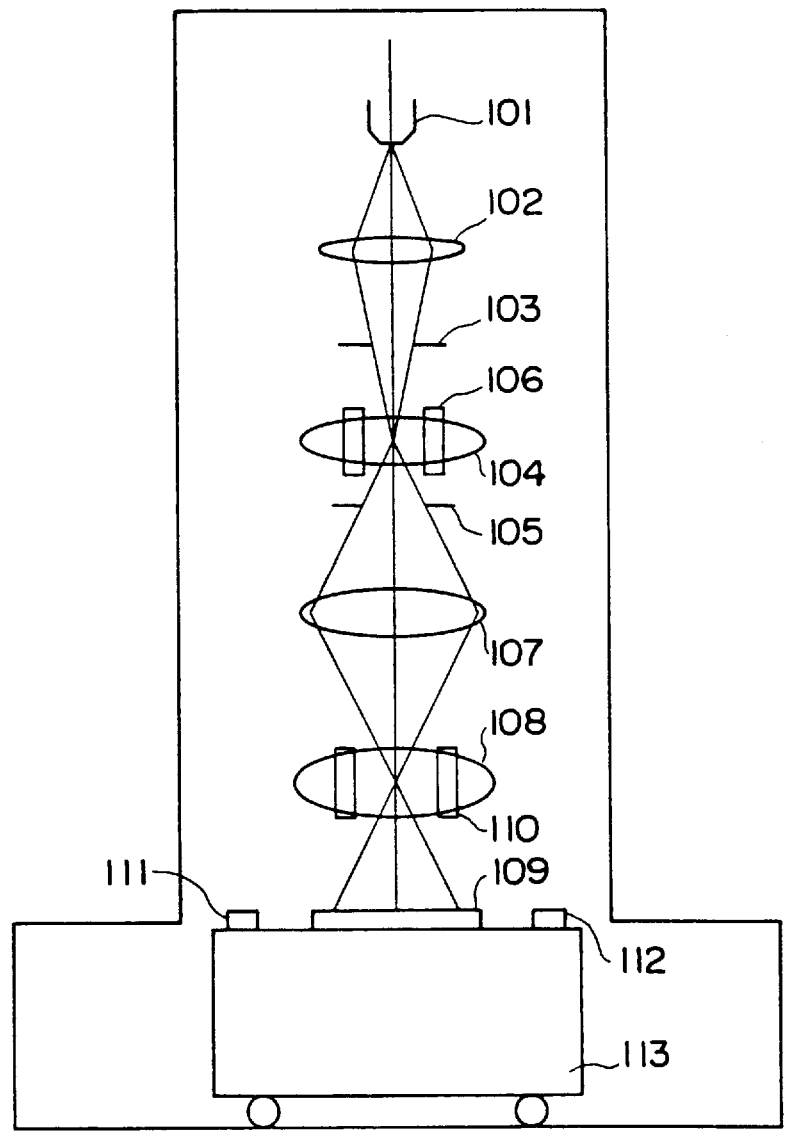
F I G. 2

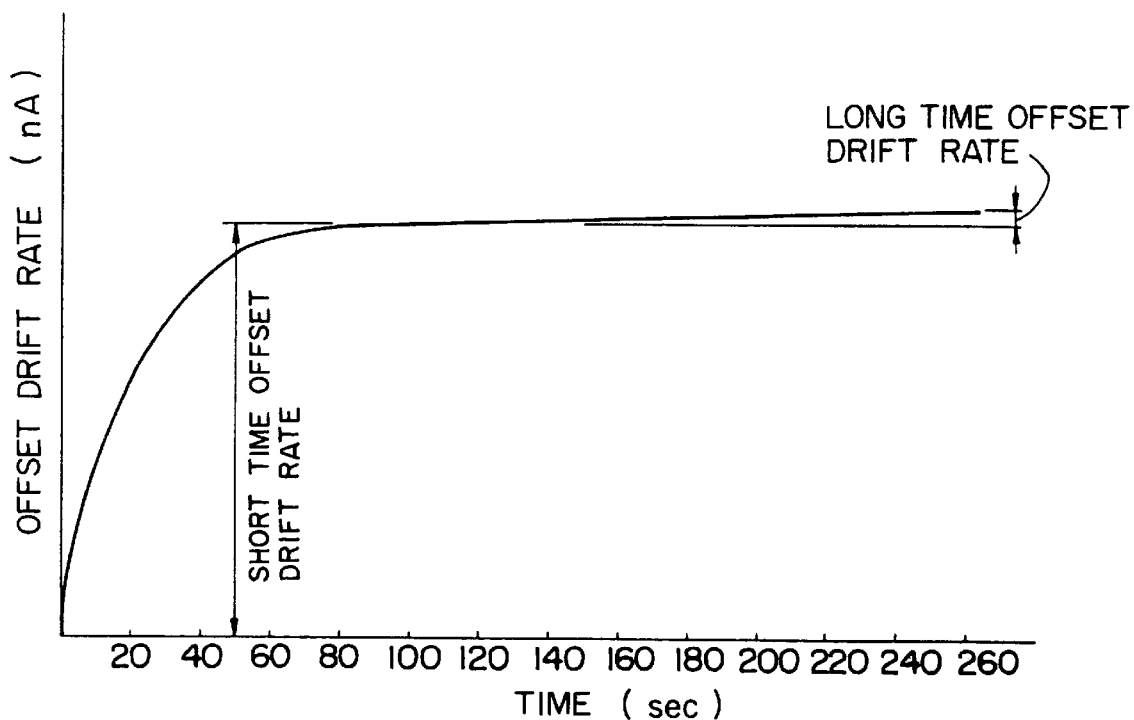
F I G. 3
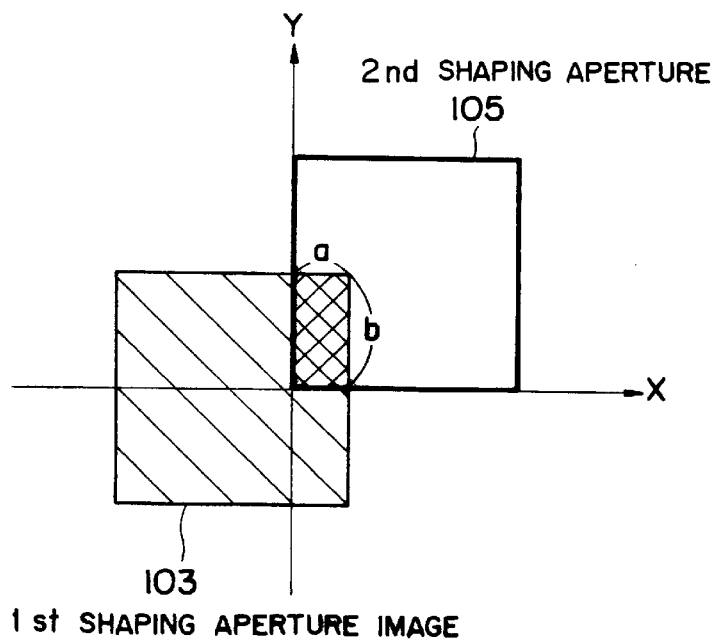
F I G. 4

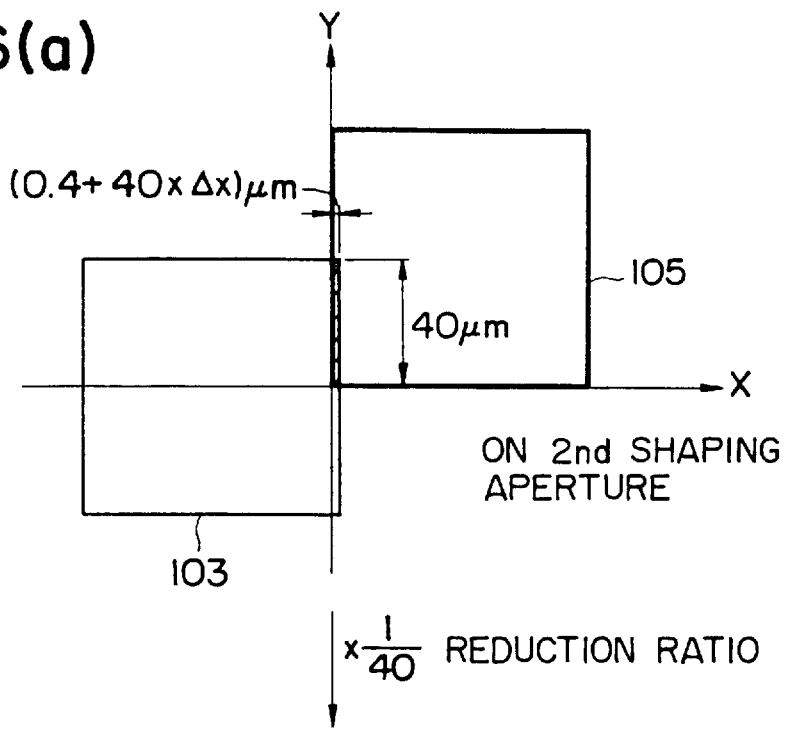
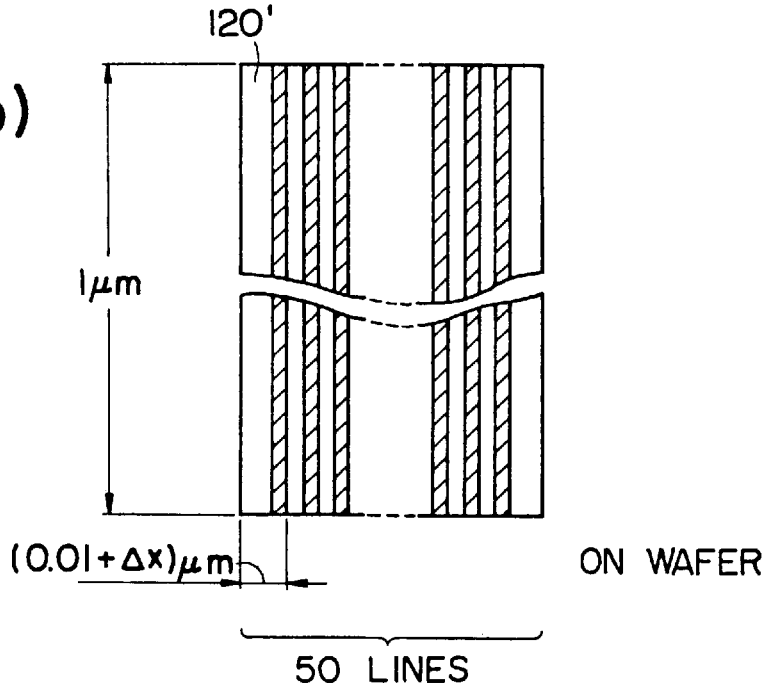

WHEN $\Delta x > \delta x$

50 — TIME SHOTS BY SHIFTING BEAM ORIGIN ON LOWER LEFT CORNER 0.01 μm BY 0.01 μm

WHEN $\Delta x = \delta x$

WHEN $\Delta x < \delta x$

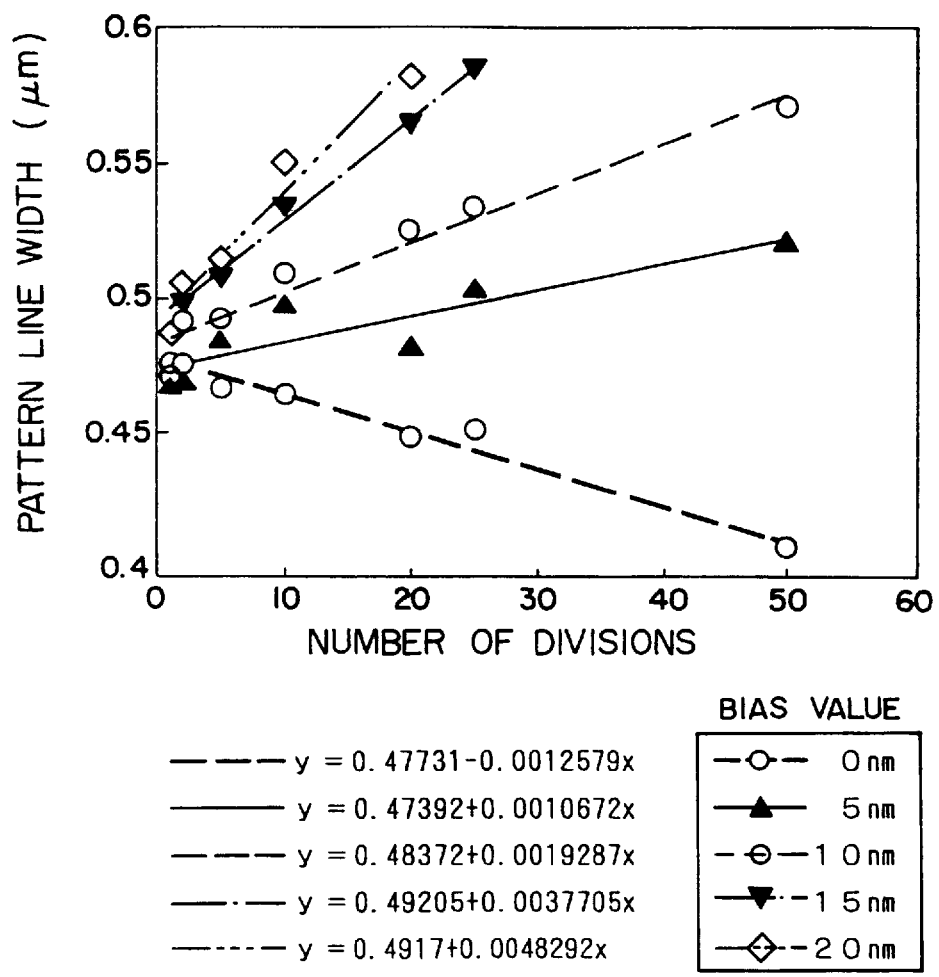
F I G. 8A
F I G. 8B

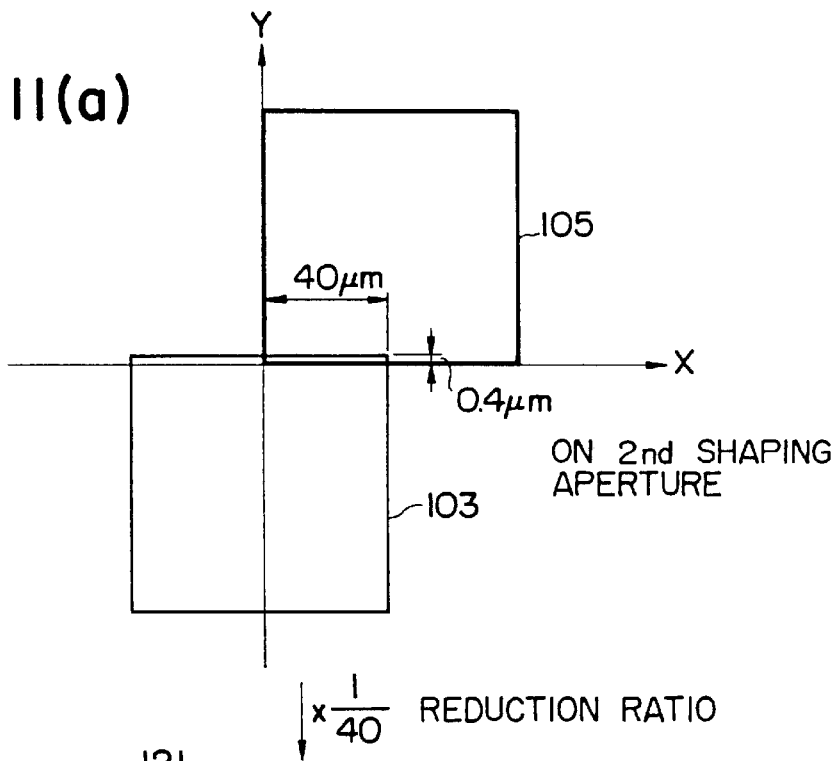
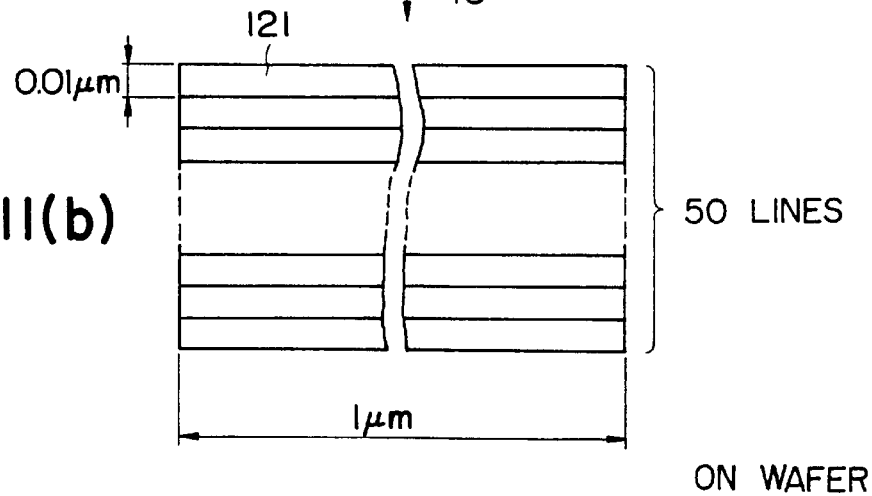

WHEN $\Delta y > \delta y$

WHEN $\Delta y = \delta y$

WHEN $\Delta y < \delta y$

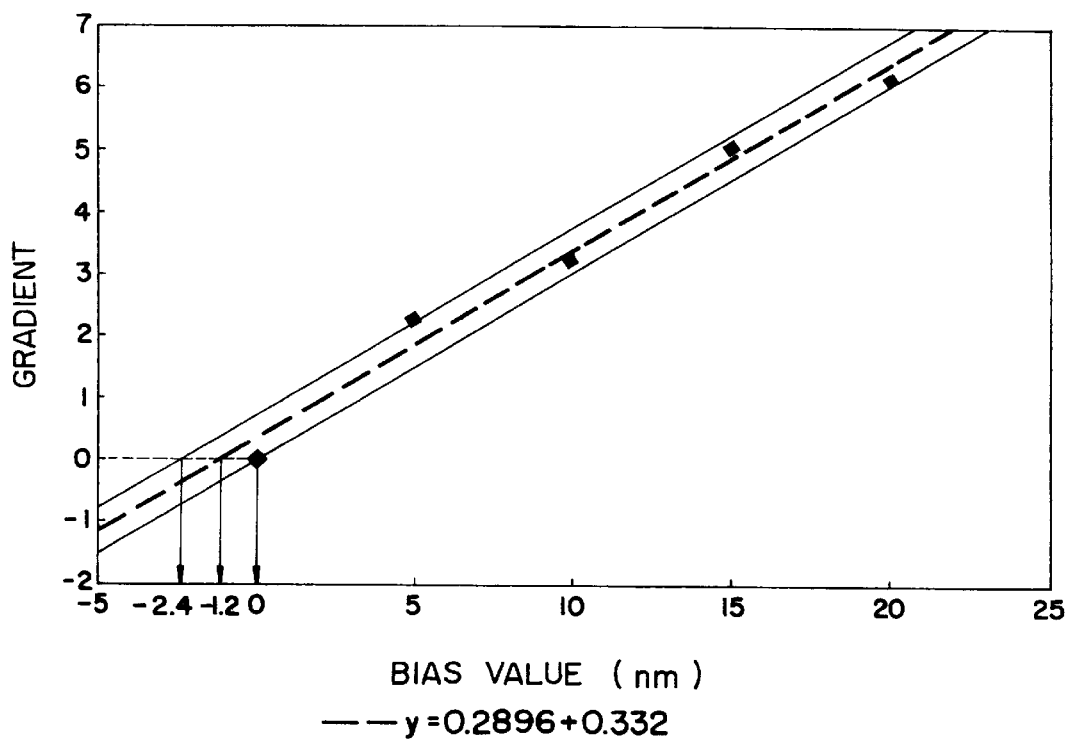
F I G. 14

$\times \frac{1}{40}$ REDUCTION RATIO

| LINE WIDTH | NOT CORRECTED | | CORRECTED | |
|---|---|---|---|---|
| | X-DIRECTION LINE | Y-DIRECTION LINE | X-DIRECTION LINE | Y-DIRECTION LINE |
| 0.135 μm | 0.133 | 0.140 | 0.134 | 0.135 |

FIG.16

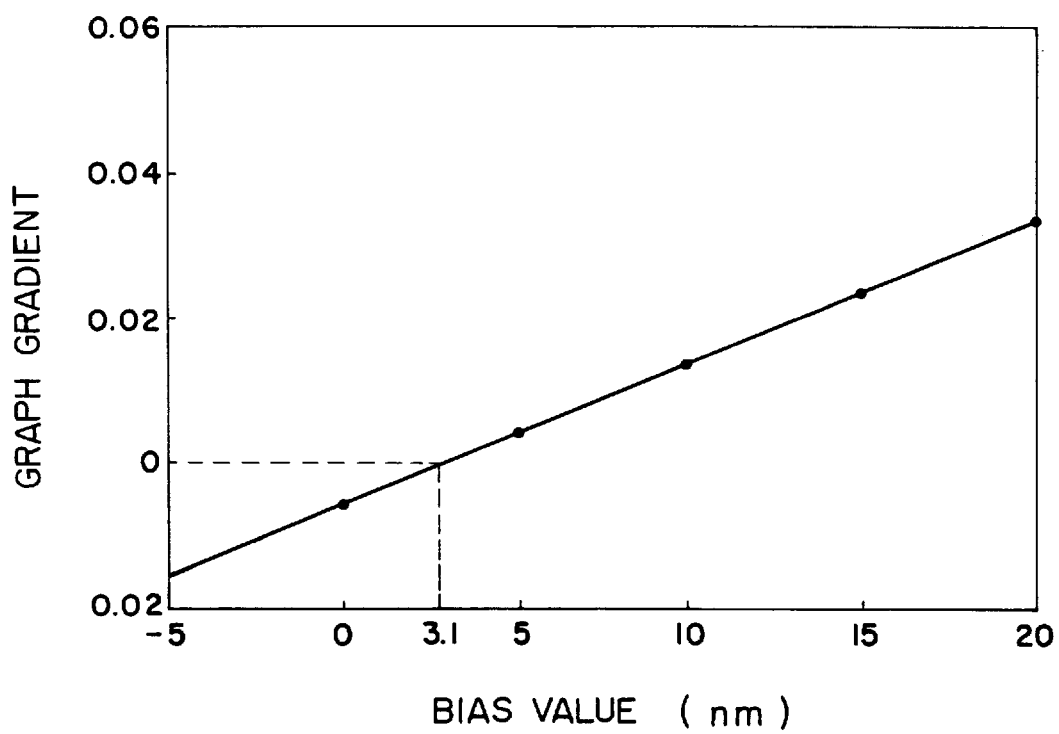
F I G. 20

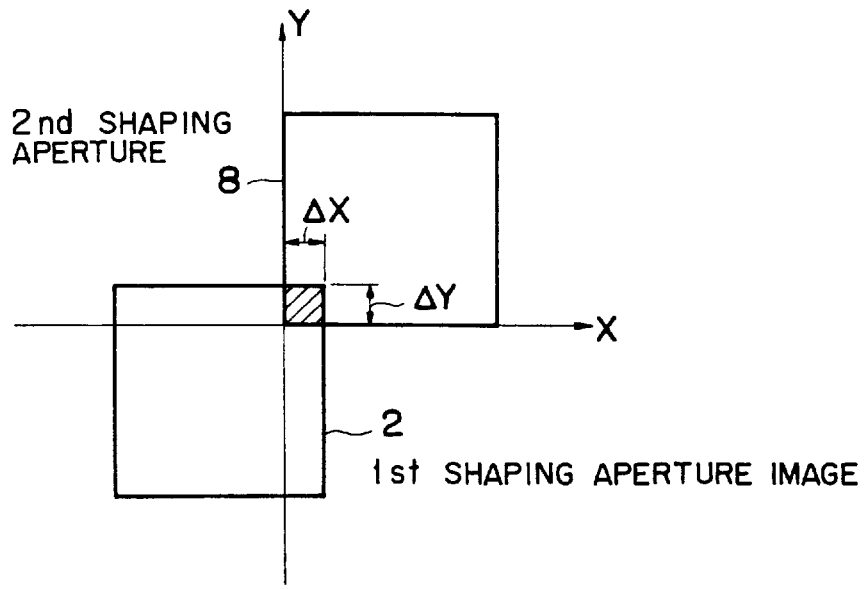
F I G. 26
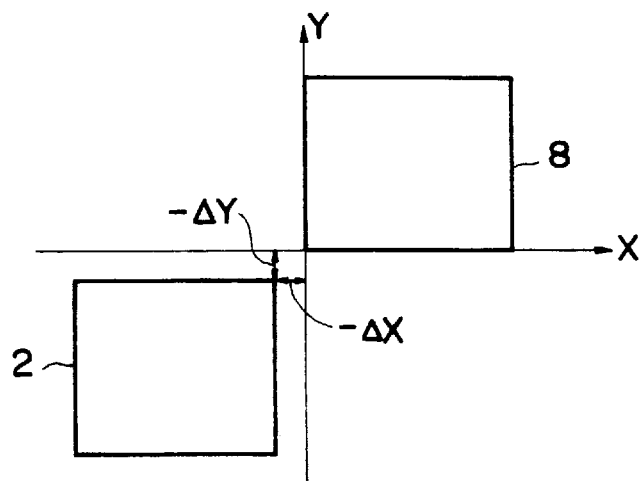
F I G. 27

METHOD OF EVALUATING SHAPED BEAM OF CHARGED BEAM WRITER AND METHOD OF FORMING PATTERN

BACKGROUND OF THE INVENTION

1. Field of the Invention

The present invention relates to a method of evaluating a beam shaped by a charged beam writer for forming a microscopic pattern on a sample surface for an ULSI, for instance and a method of forming a pattern by a charged beam, and more specifically to a method of measuring offset fluctuation rates necessary when the beam dimensions are adjusted.

2. Description of the Prior Art

Conventionally, a charged beam writer has been used to form a desired microscopic pattern on a sample such as a semiconductor wafer. Further, there exists such a charged beam writer that the dimensions of the charged beam can be changed. In the case of the of variable shaped beam writer, its pattern forming throughput is particularly high, in comparison with a spot beam writer.

By the way, in the charged beam writer of variable shaped beam type, it is necessary to adjust the beam dimensions in such a way that the set beam dimensions can match the actual beam dimensions, respectively. An example of the beam dimension adjusting method is disclosed in Japanese Patent Laid-open Publication No. 237526/88, for instance. In this method, after the respective sides of first and second shaping apertures have been adjusted so as to become parallel to each other on reference coordinates, the beam current is measured by use of a Faraday cup, while changing the beam dimension. In this case, the two shaping apertures are adjustably rotated so that an increase of the beam current according to the beam dimension change becomes linear; an offset rate is obtained on the basis of a point at which the linear beam current can be zeroed; and the obtained offset rate is corrected to obtain an actual beam in accordance with the set beam dimension.

In the above-mentioned prior art charged beam writer, however, it has been known that since the inside of an electron optical system (referred to as EOS, hereinafter) is charged by the charged beam (referred to as charge-up, hereinafter), a beam drift inevitably occurs because an electron beam orbit fluctuates. Once the beam drift occurs due to a charge-up generated inside a beam shaping deflector for controlling the beam dimensions, since the overlap position of the first shaping aperture image drifts on the second shaping aperture, the actual beam dimension has offset relative to the set beam dimensions. This implies that the offset fluctuates as a function of time (referred to as offset drift, hereinafter).

This offset drift is composed of a short time offset drift which varies largely into saturation in an extremely short time and a long time offset drift which varies slightly and gradually in a long time. The harmful influence of the offset drift upon the formed pattern develops largely with increasing miniaturization of the pattern. For instance, when the offset drift is 0.01 μm (on the sample), in the case of a pattern formed in accordance with 0.5 μm rule, the error is 2% (=0.01/0.5). In the case of a pattern formed in accordance with 0.1 μm rule, however, the error is as large as 10% (=0.01/0.1).

Furthermore, when the charge-up occurs inside an objective lens or in a resist formed on a sample, although the beam dimensions will not change, there arises another problem in that the beam position on the sample changes. In order to solve the above-mentioned beam positional error, as disclosed in Japanese Patent Laid-open Publication No. 304080/93 for instance, when a desired pattern is being formed, the irradiation position of an electron beam has been measured at constant time intervals, and the deflection rate of the electron beam has been adjusted for drift correction to prevent the precision of the pattern formation from being lowered, Although this method is effective when the drift occurs relatively gently, when the drift occurs sharply, it has been difficult to correct the drift. To overcome this problem, before forming an actual pattern, a beam is irradiated at a position away from a substance on which a pattern to be formed, for a time long enough to stabilize the beam drift; that is, a dummy beam irradiation has been so far effected to form any desired pattern.

In this method, however, since there exists no effect upon the drift which changes the beam dimensions, there still exists a problem in that it is impossible to manage the actual beam dimensions correctly when the pattern is being formed. In other words, there exist problems in that the beam dimensions measured when the beam is being adjusted fluctuate due to the offset drift and further in that even if the beam dimensions are stabilized with respect to time, the beam dimensions during the pattern formation are not clearly known. In addition, if the actual beam dimensions are tried to measure by forming an actual pattern, since the microscopic offset drift rate belongs to such a range that the linear relationship between the set dimension and the formed pattern dimension cannot be established, it is extremely difficult to obtain the microscopic offset drift rate directly on the basis of the pattern dimension.

SUMMARY OF THE INVENTION

With these problems in mind, therefore, it is a first object of the present invention to provide a shaped beam evaluating method of evaluating an offset rate between a set beam dimension and an actual beam dimension caused by the beam drift on the second shaping aperture.

Further, the second object of the present invention is to provide a method of forming a pattern by use of a charged beam, which can improve the forming precision of a microscopic pattern.

To achieve the above-mentioned object, the first aspect of the present invention provides a method of evaluating a shaped beam generated by a charged beam writer for deflecting a charged beam passed through a first shaping aperture, for shaping a variable shaped beam by controlling dimensions of the charged beam passed through a second shaping aperture, and for forming a desired pattern on a sample mounted on a movable stage by use of the variable shaped beam, comprising the steps of: a first step of shaping a line beam by dividing into 1/n one side of a shaped beam having a dimension "a" in an x direction and a dimension "b" in a y direction perpendicular to the x direction, where n is the number of divisions; a second step of irradiating the divided line beam upon a surface of the sample or the movable stage for a constant time or longer; a third step of shaping a line beam by adding a bias value δ to each divided line beam width in the divided direction; a fourth step of irradiating the shaped line beam obtained by adding the bias value to the divided line beam upon a photosensitive substance on the sample surface for a constant time for exposure; a fifth step of repeating the fourth step exposure (n−1) times by shifting the shaped line beam obtained by adding the bias value to the divided line beam, in the direction that one side of the shaped beam is divided into 1/n, and developing the photosensitive substance, to obtain a pattern width θ; a sixth step of repeating the above first to fifth steps by changing the number of divisions n and the bias value δ; and a seventh step of obtaining a change rate Δθ/Δn of the pattern width θ relative to the number of divisions n for each bias value δ, to obtain an offset drift rate on the basis of the obtained change rate and the bias value.

In the first aspect of the beam evaluation method according to the present invention, when there exists a short time offset drift in the x direction, since the offset drift rate is added to each line beam, a plurality of wider line beams are formed in parallel to each other. In other words, in the case of a negative resist for instance, the line width of the parallel formed line beams increases, as compared with when a line is formed by use of a beam of (a×b)$\mu m^2$ by one shot. Therefore, in the case where a plurality of line beams are formed in parallel to each other by adding a bias value in the x direction of the line beam methodically, only when the short time offset drift can be canceled by the bias value, the line of "a" $\mu m$ can be formed irrespective of the number of divisions n. Therefore, it is possible to obtain the offset drift rate in the x direction on the basis of the bias value.

Further, in the second aspect of the beam evaluation method according to the present invention, the offset drift rate is obtained in the x or y direction; the beam dimension is corrected on the basis of the obtained offset drift rate; and a pattern is formed on the basis of the corrected beam dimension.

In this second aspect of the beam evaluation method according to the present invention, when there exists an offset drift in the x direction, since the offset drift rate is added to each beam, the amount of the electric charge increases, as compared with when a beam of (a×b)$\mu m^2$ is irradiated into the Faraday cup for a constant time by one shot. Therefore, when the amount of the electric charge is measured repeatedly by adding the bias value to the line beam in the x direction methodically, only when the short time offset can be canceled by the bias value, the amount of the electric charge is equalized to the amount of the electric charge of one shot, irrespective of the number of divisions n. Therefore, the offset drift rate can be obtained on the basis of the bias value under this condition.

The second aspect of the beam evaluation method according to the present invention provides a method of evaluating a shaped beam generated by a charged beam writer for deflecting a charged beam passed through a first shaping aperture, for shaping a variable shaped beam by controlling dimensions of the charged beam passed through a second shaping aperture, and for forming a desired pattern on a sample mounted on a movable stage by use of the variable shaped beam, comprising the steps of: a first step of shaping a line beam by dividing into 1/n one side of the shaped beam having a dimension "a" in an x direction and a dimension "b" in a y direction perpendicular to the x direction, where n is the number of divisions; a second step of irradiating the divided line beam upon a surface of the sample or the movable stage for a constant time or longer; a third step of shaping a line beam by adding a bias value δ to each divided line beam width in the divided direction; a fourth step of repeating n times an irradiation of the line beam obtained by adding the bias value to the divided line beam into a Faraday cup on the movable stage for a constant time, to obtain a sum total value Σ of n-time amount of irradiation electric charges; a fifth step of repeating the above first to fourth steps by changing the number of divisions n and the bias value δ; and a sixth step of obtaining a change rate ΔΣ/Δn of the sum total Value Σ of the irradiation rates relative to the number of divisions n for each bias value δ, to obtain an offset drift rate on the basis of the obtained change rate and the bias value.

The offset drift rate can be obtained in accordance with the above-mentioned first and second aspects.

Further, it is preferable that the beam dimension correcting value obtained on the basis of the offset drift rate is updated whenever the sum total of the pattern formation time exceeds a predetermined time.

BRIEF DESCRIPTION OF THE DRAWINGS

FIG. 2 is a diagrammatical structural view showing an charged beam writer;

FIG. 3 is a graphical representation showing the measured results of the offset drift;

FIG. 4 is a graphical representation showing a positional relationship between a first shaping aperture image and a second shaping aperture after the beam dimensions have been adjusted;

FIGS. 6(a) and 6(b) are illustrations for assistance in explaining the line beams arranged in the x direction when there exists an offset drift;

FIG. 8A is a graphical representation showing the relationship between the width dimension of the resist pattern and the number of divisions n with the bias value $\delta_x$ as a parameter;

FIG. 8B is a table listing the offset change rates (the bias values $\delta_x$) and the corresponding gradients of the formed line widths;

FIGS. 11(a) and 11(b) are illustrations for assistance in explaining line beams arranged in the y direction when there exists no offset drift;

FIG. 14 is a graphical representation showing the formed line width gradients (the resist pattern width dimension/the number of divisions) at the respective bias values $\delta_y$;

FIGS. 16 is a table for assistance in explaining the effect of correcting the offset drifts;

FIG. 20 is a graphical representation showing the gradients (the amount of electric charge/the number of divisions) at the respective bias values $\delta_x$;

FIG. 26 is a simplified illustration showing a change in positional relationship between the first shaping aperture image and the second shaping aperture obtained after the beam dimension adjustment has been completed, on condition that a beam drift exists even if the beam dimension is set to zero;

FIG. 27 is a simplified illustration showing the positional relationship between the first shaping aperture image and the second shaping aperture, obtained when the beam drift is previously shifted.

DETAILED DESCRIPTION OF THE PREFERRED EMBODIMENTS

A first embodiment of the method of evaluating the shaped beam generated by a charged beam writer according to the present invention will be described hereinbelow with reference to FIGS. 1 to 16.

Figure 1:
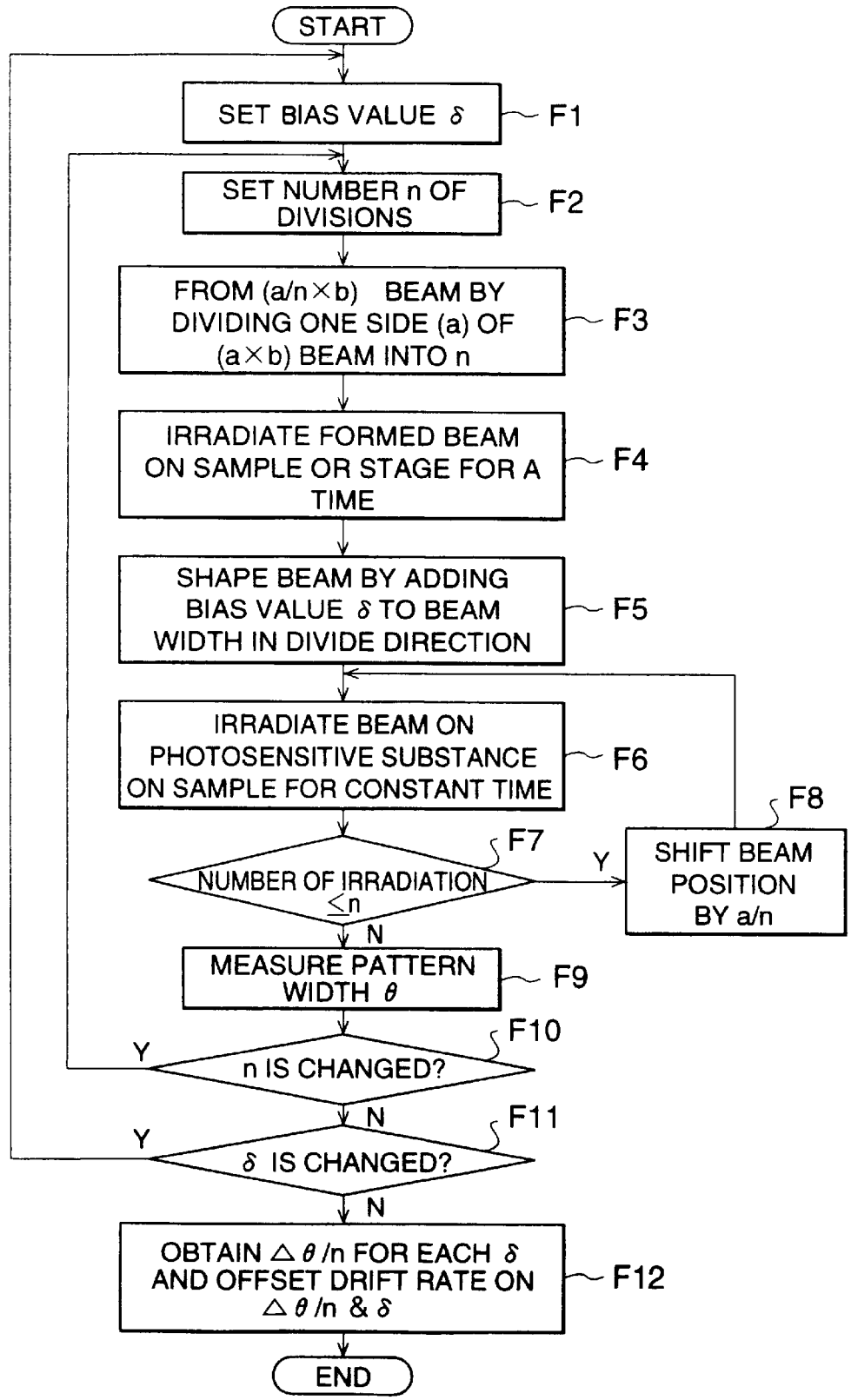
FIG. 1 is a flowchart showing the evaluation procedure of the first embodiment of the shaped beam evaluating method according to the present invention.
Figure 5A:
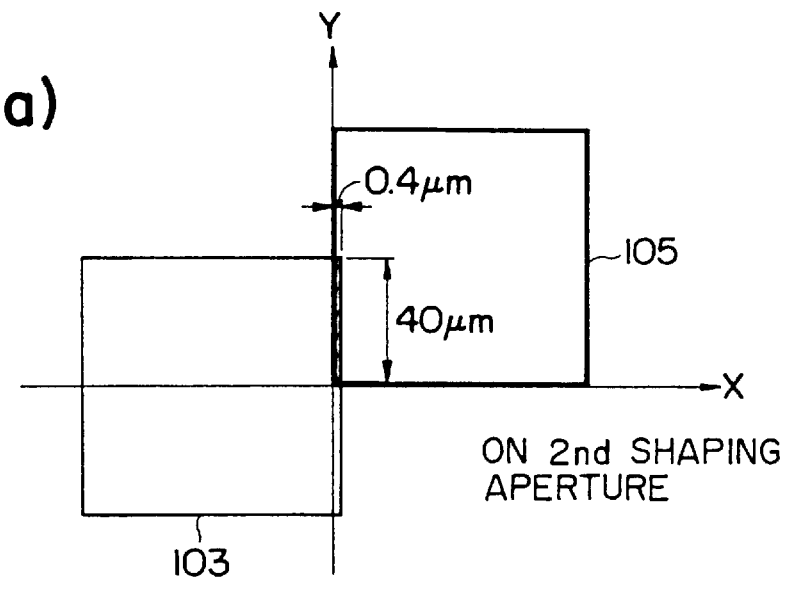
FIGS. 5(a) and 5(b) are illustrations for assistance in explaining line beams arranged in an x direction when there exists no offset drift.
Figure 5B:
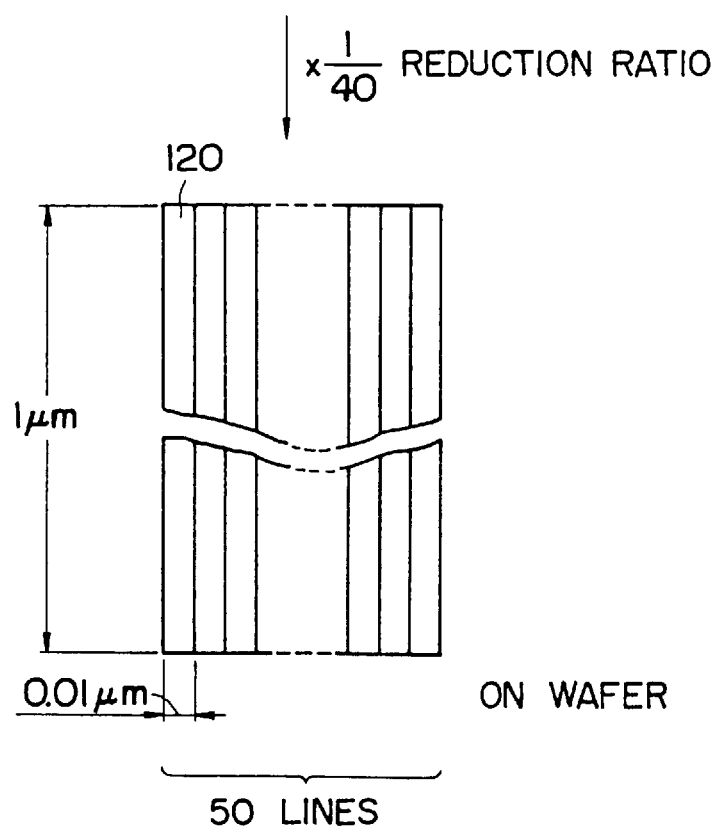

FIG. 1 is a flowchart showing the procedure of the first embodiment according to the present invention. Further, FIG. 2 is a diagrammatical structural view showing the charged beam writer related to the method according to the present invention.

In FIG. 2, an electron beam emitted by an electron gun 101 is irradiated upon a first shaping aperture 103 through a condenser lens 102. The image of the first shaping aperture image 103 is focused upon a second shaping aperture 105 through a projection lens 104. Here, the beam dimensions can be changed by controlling the overlap rate between two shaping apertures 103 and 105 by use of a beam shaping deflector 106. An image obtained as an overlap between the two shaping apertures 103 and 105 is reduced and focused on a sample 109 through a reduction lens 107 and an objective lens 108. Further, the beam position on the sample surface is controlled by a main deflector 110. On the other hand, the sample 109 is mounted on a movable stage 113 together with a Faraday cup 111 and a marking base 112 for measuring the beam dimensions. Therefore, when the movable stage 113 is moved, it is possible to select any one the sample 109, the Faraday cup 111 and the marking base 112, respectively.

Prior to the detailed description of the method of measuring the offset drift, the offset drift which changes the beam dimensions will be explained hereinbelow. When a deflected voltage is applied to a blanking electrode (not shown), since an electron beam shut off by a blanking aperture (not shown) is allowed to reach the sample 109, an electric charge begins to be charged up (referred to as charge-up, hereinafter) inside the beam shaping deflector 106 and saturates soon therein. Here, the beam orbit changes due to the charge-up in the shaping deflector 106. The change of beam dimension can be known by measuring a beam current by use of the Faraday cup 111 mounted on the movable stage 113. FIG. 3 shows the measurement results of the offset drift, in which the beam current is plotted according to the time elapsed. FIG. 3 shows a change of the beam dimension obtained after the blanking has been released. FIG. 3 indicates that the offset drift saturates within a several minutes and then increases slightly and very slowly in the charged beam writer. On the other hand, when the deflected voltage of the blanking is applied again, the charged-up rate is reduced down to about zero with the lapse of the same time as above, and then reaches a zero after a relatively long time has elapsed.

In contrast with this, since the net time required to irradiate the beam upon the sample for beam dimension adjustment is as short as several seconds, the beam shaping deflector 106 is not charged up within this short time period, so that any offset drift will not be occurred. However, once the pattern formation is started, although the beam is irradiated upon the sample by repeating the blanking and/or unblanking, since the blanking time is extremely short, this is practically equivalent to that the beam is kept irradiated upon the sample 109. As a result, the offset drift saturates almost within several minutes, and then increases very slowly.

Accordingly, in order to manage the beam dimensions accurately during pattern formation, it is necessary to correct the short time offset drift generated at least by the pattern formation continued during a constant time period. Further, when a still higher precision is required, it can be understood that the long-time offset drift must be also corrected.

Here, the method of measuring the offset drift in the charged beam writer will be described hereinbelow.

In accordance with the prior art beam dimension adjusting method as disclosed in Japanese Patent Laid-open Publication No. 237526/88, first the respective sides of the first shaping aperture and the second shaping aperture are matched with respect to each other in such a way as to become parallel to each other on reference coordinates. After that, the beam current is measured with the use of the Faraday cup by changing the beam dimension. In this case, the offset is adjusted by the beam shaping deflector by matching the aperture rotations in such a way that an increase of the beam current according to the change of the beam dimension can be expressed as a straight line, and further by extrapolating the beam current value obtained when the set beam dimension is changed on the basis of a linear function in such a way that the obtained straight line can pass through the origin. FIG. 4 shows the positional relationship between the first shaping aperture image 103 and the second shaping aperture 105 during the beam dimension adjustment.

Successively, after a bias value δ and the number of divisions n (both described later) have been set, as shown by steps F1 and F2 in FIG. 1, a beam of (a×b)$\mu m^2$ is shaped by overlapping the first shaping aperture image 103 with the second shaping aperture 105. In the charged beam writer used for the method according to the present invention, the beam shaped by the second shaping aperture 105 is irradiated upon the surface of a sample (wafer) after being reduced down to 1/40. Therefore, the beam of (0.5×1)$\mu m^2$ on the wafer can be obtained by overlapping the first shaping aperture image 103 with the second shaping aperture 105 in such a way that the overlapped size (a×b) becomes 20×40 $\mu m^2$ on the second shaping aperture 105.

(Measurement of short time offset drift in x direction)

Here, a beam having a size of 0.5×1 $\mu m^2$ on the wafer is taken into account. Further, the case where one side 0.5 $\mu m$ in the x direction is divided into n (e.g., n=50) will be considered. A line beam 120 of 0.01×1 $\mu m^2$ on the wafer is determined by the beam dimension adjustment, that is, by overlapping the first shaping aperture image 103 with the second shaping aperture 105 by use of the beam shaping deflector 106 (See the upper side in FIG. 5(a)), as shown by step F3 in FIG. 1. Further, the pattern formation is started by use of this shaped beam 120. That is, after an electric charge has been charged up inside the beam shaping deflector 106, a pattern obtained by arranging 50 units of (0.01×1)$\mu m^2$ beams 120 (See the lower side in FIG. 5(b)) is formed by shifting the beam 120 0.01 $\mu m$ by 0.01 $\mu m$ by irradiating the shaped beam 120 at constant beam irradiation time intervals by the main deflector 110, as shown by step F4 in FIG. 1. Here, when a short time offset drift Δx exists in the x direction (although a similar drift exists in the y direction, this is neglected, herein), the offset drift Δx is added to the beam 120 shaped to the (0.01×1)$\mu m^2$ dimension in the width direction. Therefore, when the pattern is actually formed, the beam 120 changes to another (0.01+Δx)×1 $\mu m^2$ beam 120', as shown by the lower side in FIG. 6(b). That is, when 50 units of the beams 120' are arranged to form a pattern, the pattern of 0.5×1 $\mu m^2$ cannot be formed, but a pattern having a dose rate increasing by (50×Δx) over a designed value can be formed, as shown by steps F5, F6, F7, and F8 in FIG. 1.

Figure 7A:
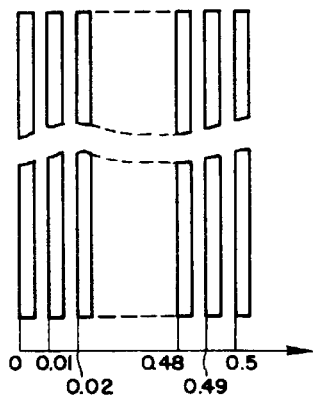
FIGS. 7A, 7B and 7C are illustrations showing the formed patterns obtained, respectively on the basis of the relative relationship between the offset drift Δx and a bias value $\delta_x$.
Figure 7B:
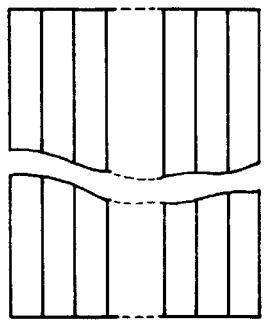
Figure 7C:
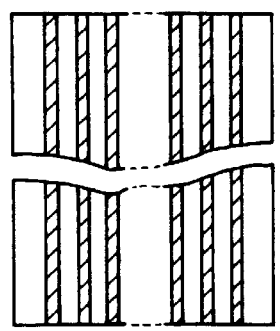

Here, the method of examining the beam drift by forming microscopically divided beams in parallel to each other is disclosed in Japanese Patent Application No. 5-195710. Therefore, when lines are continuously formed in parallel to each other by adding a bias value $\delta_x$ to the line beam 120 in the line beam width (x) direction methodically, it is possible to compare the pattern line width with each $\delta_x$ under the condition that the short time offset drift is almost kept saturated. FIGS. 7A, 7B and 7C show the relative relationship between the offset drift Δx and the bias value $\delta_x$, respectively.

In the case of a resist development process in which the line width of the resist pattern can be finished just as 50×0.01=0.5 $\mu m$, when Δx=$\delta_x$ as shown in FIG. 7B, the line width of the resist pattern is correctly formed. However, when Δx>$\delta_x$ as shown in FIG. 7A, the line width thereof is narrowed in under-dose condition; and when Δx<$\delta_x$ as shown in FIG. 7C, the line width thereof is widened in over-dose condition. Here, when Δx=$\delta_x$, the line width (0.5 $\mu m$ in this embodiment) is not dependent upon the number of divisions n. However, since the ratio of the offset drift rate to the beam line width increases with increasing n, when the number of divisions n increases, even if the offset drift rate is small, the influence upon the offset drift develops remarkably, so that the evaluation can be facilitated. This is because when n is a small number, it is difficult to compare between when n is a small number and when n is 1. In other words, when the line width is measured by use of a scanning electron microscope for instance, the measured values disperse largely.

Accordingly, the resist pattern widths θ are obtained by changing the number of division n, with the bias value $\delta_x$ as a parameter, as shown by steps F9, F10 and F11 in FIG. 1.

Figure 9:
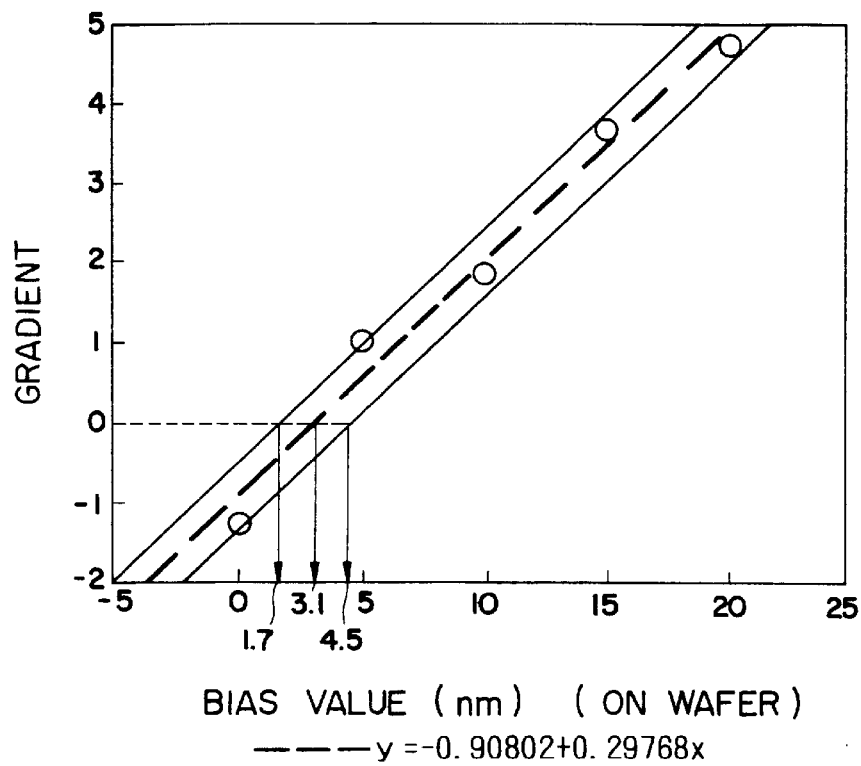
FIG. 9 is a graphical representation showing the formed line width gradients at the respective bias values $\delta_x$.

FIG. 8A shows the relationship between the resist pattern dimension (the formed line width) and the number of divisions n, when the bias value $\delta_x$ is used as a parameter. Further, FIG. 8B shows a table listing the relationship between the offset change rates (the bias values) and the gradients of the regression lines obtained for each parameter point $\delta_x$. Further, FIG. 9 is a graph showing the relationship between the respective bias values $\delta_x$ and the gradients of the regression lines. In FIG. 9, the bias value at which the gradient is zero is the offset drift. On the basis of FIG. 9, the bias values $\delta_x$ staying in the dispersion range of the regression lines (i.e., of the present experiment system) can be obtained between 1.7 nm and 4.5 nm. Therefore, the central value is 3.1 nm. As a result, it can be understood that there exists an offset drift of 3.1 nm in the x minus direction, as shown by step F12 in FIG. 1.

(Measurement of short time offset drift in y direction)

Figure 10:
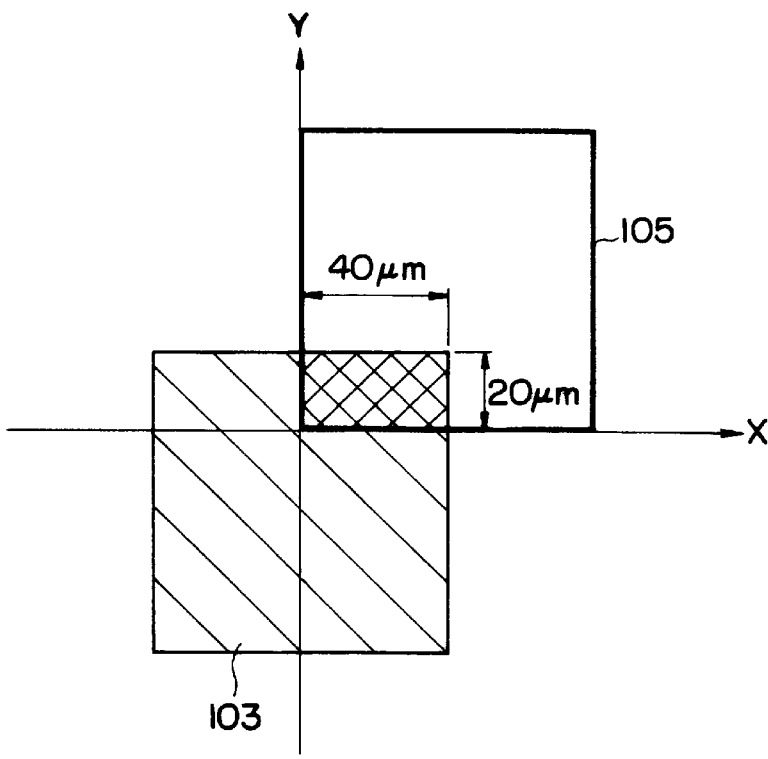
FIG. 10 is a graphical representation showing a positional relationship between the first shaping aperture image and the second shaping aperture after the beam dimension has been adjusted.
Figure 12A:
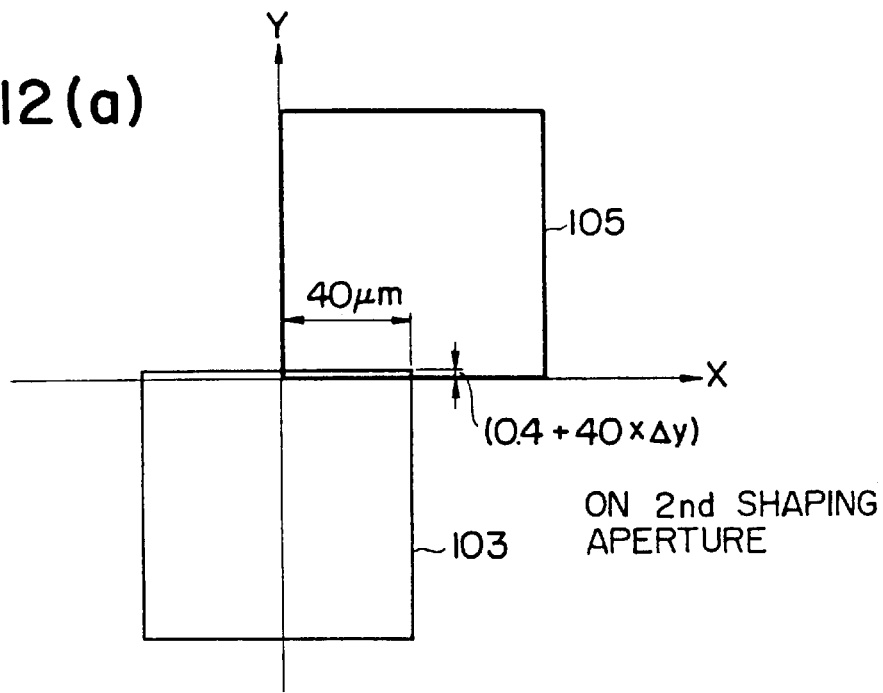
FIGS. 12(a) and 12(b) are illustrations for assistance in explaining the line beams arranged in the y direction when there exists an offset drift.
Figure 12B:
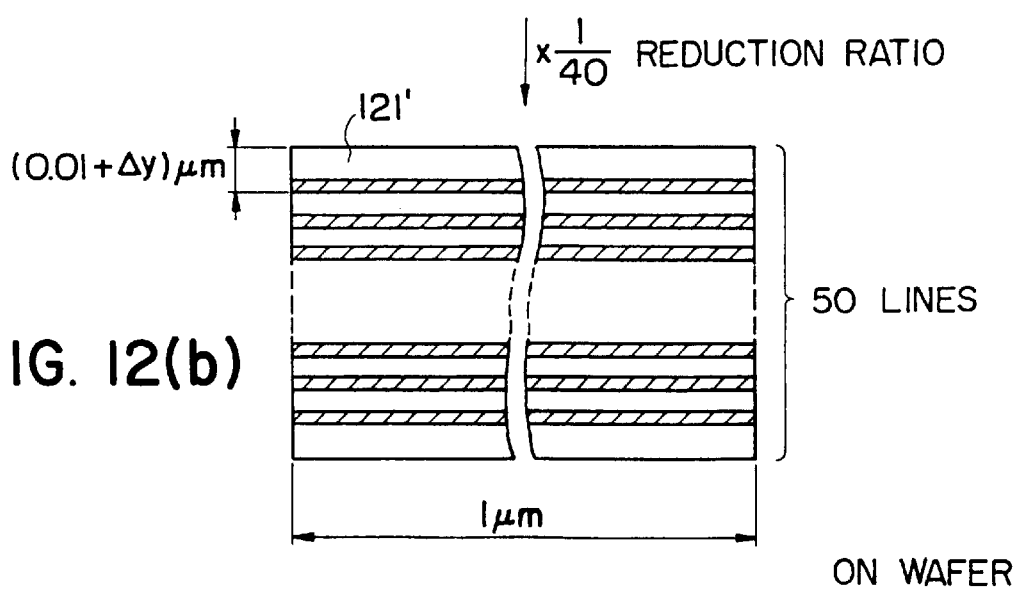
Figure 13A:
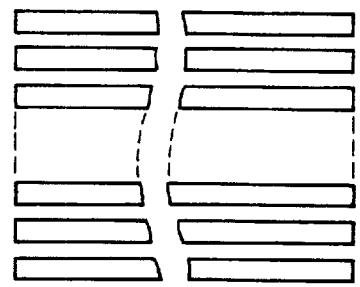
FIGS. 13A, 13B and 13C are illustrations for showing the formed patterns obtained respectively, on the basis of the relative relationship between the offset drift Δy and a bias value $\delta_y$.
Figure 13B:
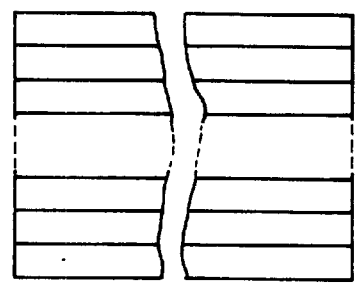
Figure 13C:
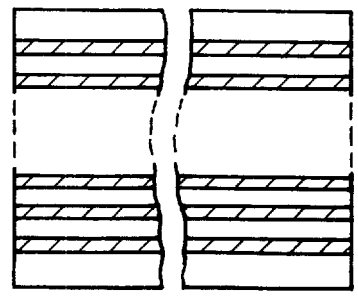
Figure 15A:
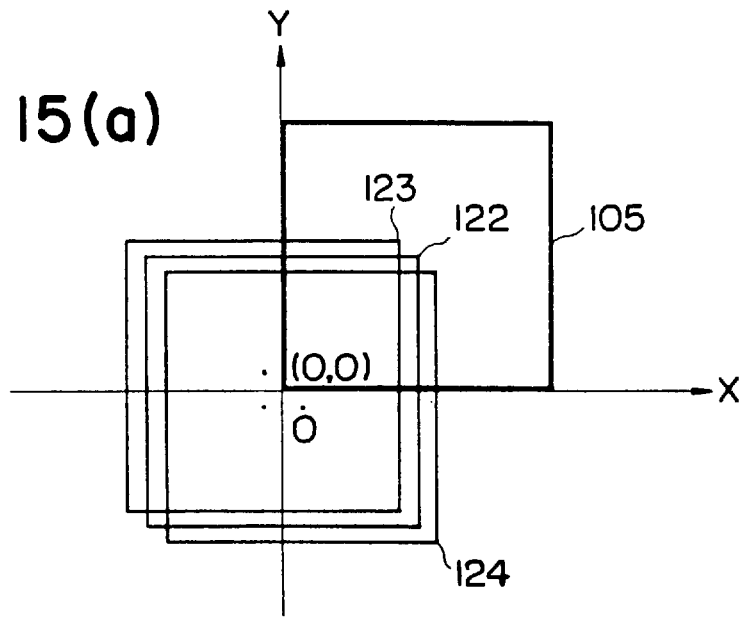
FIGS. 15(a)–(c) are illustrations for assistance in explaining the method of adjusting the beam dimension under consideration of Δx and Δy.
Figure 15B:
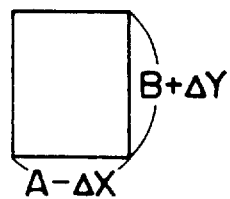
Figure 15C:
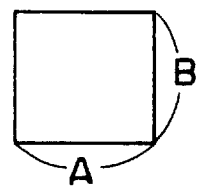

Here, a beam having a size of 1×0.5 $\mu m^2$ on the wafer is taken into account. This beam can be obtained as an overlap of 40×20 $\mu m^2$ on the second shaping aperture, as shown in FIG. 10. Further, the case where one side 0.5 $\mu m$ in the y direction is divided into n (e.g. n=50) will be considered. A line beam 121 of 1×0.01 $\mu m^2$ on the wafer is determined by the beam dimension adjustment, that is, by overlapping the first shaping aperture image 103 with the second shaping aperture 105 by use of the beam shaping deflector 106 (See the upper side in FIG. 12(a)). Further, the pattern formation is started by use of this shaped beam 121. That is, after an electric charge has been charged up inside the beam shaping deflector 106, a pattern obtained by arranging 50 units of (1×0.01)$\mu m^2$ beams 121 (See the lower side in FIG. 12(b)) is formed by shifting the beam 121 0.01 $\mu m$ by 0.01 $\mu m$ by irradiating the shaped beam 121 at constant beam irradiation time intervals by the main deflector 110. Here, when a short time offset drift Δy exists in the y direction (the drift in the x direction is neglected herein), the offset drift Δy is added to the beam 121 shaped to the (1×0.01)$\mu m^2$ dimension in the width direction. Therefore, when the pattern is actually formed, the beam 121 changes to another 1×(0.01+Δy)$\mu m^2$ beam 121'. That is, when 50 units of the beams 121' are arranged to form a pattern, the pattern of 1×0.5 $\mu m^2$ cannot be formed, but a pattern having a dose rate increasing by (50×Δy) over a designed value is formed. Therefore, when lines are continuously formed in parallel to each other by adding a bias value $\delta_y$ to the line beam 121 in the line beam width (y) direction methodically, it is possible to compare the pattern line width with each $\delta_y$ under the condition that the short time offset drift is almost kept saturated. FIGS. 13A, 13B and 13C show the relative relationship between the offset drift Δy and the bias value $\delta_y$, respectively.

In the case of a resist development process in which the line width of the resist pattern can be finished just as 50×0.01=0.5 $\mu m$, when Δy=$\delta_y$ as shown in FIG. 13B, the line width of the resist pattern is correctly formed. However, when $\Delta y > \delta_y$ as shown in FIG. 13A, the line width thereof is narrowed in under-dose condition; and when $\Delta y < \delta_y$ as shown in FIG. 13C, the line width is widened in over-dose condition. Here, when $\Delta x = \delta_y$, the line width (0.5 $\mu$m in this embodiment) is not dependent upon the number of divisions n. However, since the ratio of the offset drift rate to the beam line width increases with increasing n, when the number of division n increases, even if the offset drift rate is small, the influence upon the offset drift develops remarkably, so that the evaluation can be facilitated. This is because when n is a small number, it is difficult to compare between when n is a small number and when n is 1. In other words, when the line width is measured by use of a scanning electron microscope for instance, the measured values disperse largely. In the same way as with the case of the x direction as shown in FIGS. 8A and 8B, the relationship between the resist pattern dimension and the number of divisions n with the bias value $\delta_y$ as the parameter is obtained; the regression lines are obtained at each parameter point; and the gradients of the regression lines are obtained. FIG. 14 is a graph showing the relationship between the respective bias values $\delta_y$ and the gradients of the regression lines. On the basis of FIG. 14, the bias values $\delta_y$ staying in the dispersion range of the regression lines (i.e., of the present experiment system) can be obtained between -2.4 nm and 0 nm. Therefore, the central value is -1.2 nm. As a result, it can be understood that there exists an offset drift of 1.2 nm in the y plus direction.

Successively, the beam dimensions are adjusted under consideration of the obtained offset drifts $\Delta x$ and $\Delta y$. The adjustment procedure will be described hereinbelow with reference to FIGS. 15(a)–(c).

In accordance with the prior art beam dimension adjusting method as disclosed in Japanese Patent Laid-open Publication No. 237526/88, first the respective sides of the first shaping aperture and the second shaping aperture are matched with respect to each other in such a way as to become parallel to each other on reference coordinates. After that, the beam current is measured with the use of the Faraday cup by changing the beam dimension. In this case, the offset is adjusted by the beam shaping deflector by matching the aperture rotations in such a way that an increase of the beam current according to the change of the beam dimension can be expressed as a straight line, and further by extrapolating the beam current value obtained when the set beam dimension is changed on the basis of a linear function in such a way that the obtained straight line can pass through the origin.

As a result, when a beam of $A \times B \mu m^2$ is required on the wafer, the overlap 122 between the first shaping aperture image and the second shaping aperture is adjusted so as to be $40 \times (A \times B)$, where 40 is a reciprocal number of the reduction ratio. In the above-mentioned example, however, since there exist the offset drifts in both the x and y directions, when the beam is irradiated upon the sample for a constant time or longer, the overlap 123 becomes $40 \times \{(A-\Delta x) \times (B+\Delta y)\}$. Therefore, the bias values $\delta_x$ and $\delta_y$ are previously added in the beam adjustment to cancel the offset drifts in both the x and y directions. That is, the overlap 124 is set to $40 \times \{(A+\delta_x) \times (B-\delta_y)\}$. This addition is equivalent to that the beam origin located on the lower left corner of the second shaping aperture 105 is shifted to an 0 point as shown on the upper side in FIG. 15(a). By doing this, after the beam has been irradiated upon the sample for a constant time or longer, the bias values previously determined on the basis of the offset drifts can be canceled, with the result the beam origin can be located at a position (0, 0). This correction by addition of the bias values can be achieved by use of the beam shaping deflector 106 for controlling the position of the first shaping aperture image, while checking an increase or decrease in the current rate measured by the Faraday cup mounted on the movable stage, for instance.

FIG. 16 is a table which lists the experimental results obtained when the offset drifts are corrected in accordance with the evaluation method according to the present invention and when not corrected. When a pattern with a line width of 0.135 $\mu$m is formed without correcting the offset drifts, the pattern width dimension in the y direction is wide, as compared with that in the x direction. The difference in line width between x and y directions is as large as about 5% of the reference dimension (0.135 $\mu$m). In contrast with this, when corrected in accordance with the above-mentioned method, the difference between the two can be reduced less than 1%.

As described above, in the evaluation method according to the present invention, the short time offset drift rate is first obtained in both the x and y directions, respectively by dividing the beam microscopically into a plurality of line beams and by adding the bias value $\delta$ to the width direction thereof methodically, on the basis of the fact that when the addition of the short time offset drift rate $\Delta$ and the bias value $\delta$ is zero as $\delta + \Delta = 0$, the pattern formed by arranging n-units of microscopically divided beams is not dependent upon the number of divisions n. Further, the beam dimension is adjusted previously under consideration of the obtained offset drift rate. As a result, when a pattern is formed, the beam dimension can be managed reliably, and thereby it is possible to provide a stable and reliable charged beam writer.

Further, in the above-mentioned first embodiment, although the pattern width $\theta$ is measured after the beam has been irradiated by n-times and further the resist has been developed as shown by step F9 in FIG. 1, it is of course possible to measure the pattern width $\theta$ by irradiating beams upon the resist on the wafer by changing both the values of n and $\delta$, respectively and then by developing the resist; in other words, step F9 can be effected after step F10 or step F11).

A second embodiment of the method of evaluating the shaped beam of the charged beam writer according to the present invention will be described hereinbelow with reference to FIGS. 17 to 22.

This second embodiment is mainly different from the first embodiment in that the short time offset drift is calculated by measuring the amount of electric charge with the use of the Faraday cup without forming any pattern on the wafer. Further, in this second embodiment, the amount of electric charge can be measured directly by use of a CCD (Charge Coupled Device) sensor, for instance.

Figure 17:
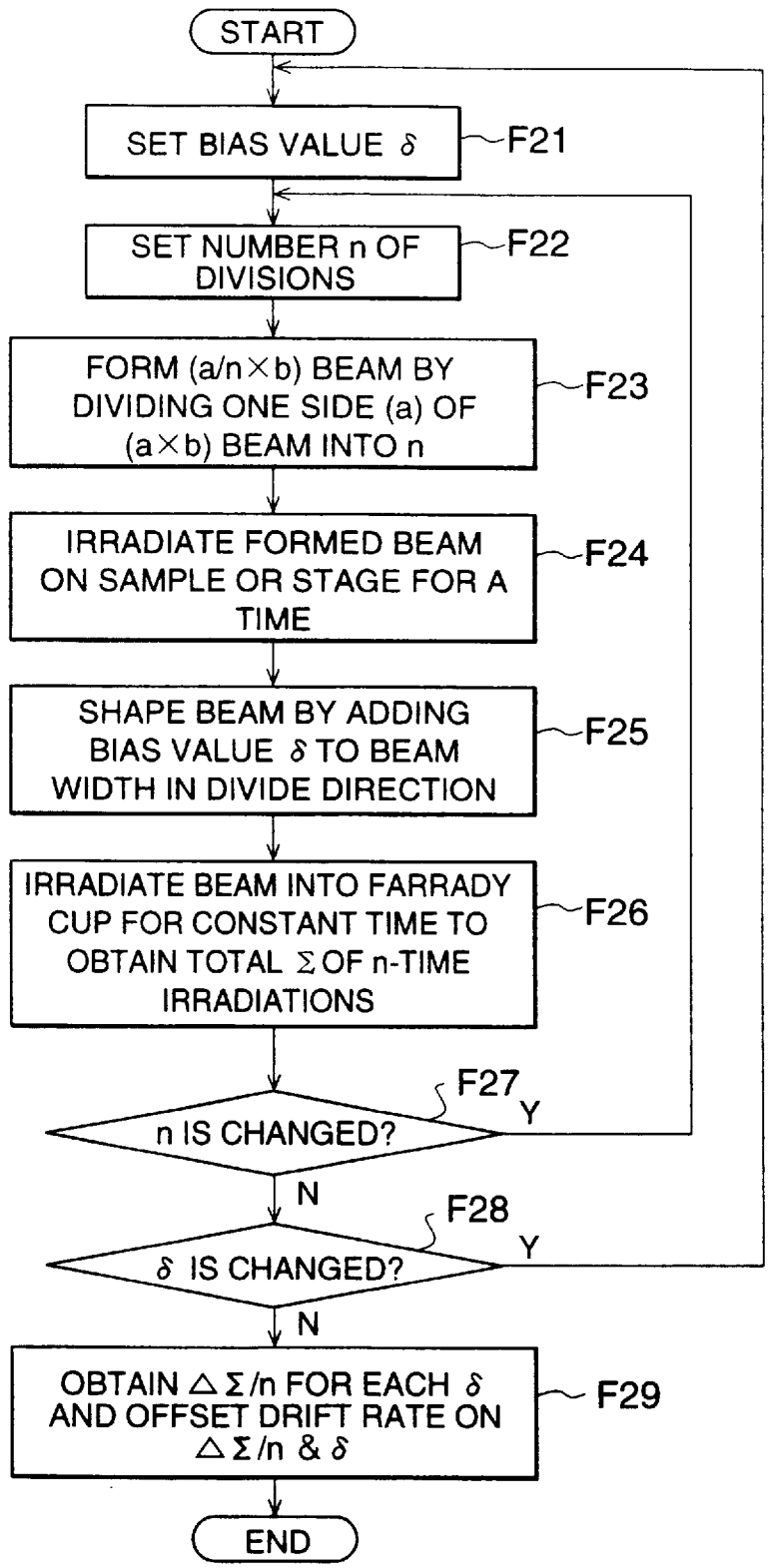
FIG. 17 is a flowchart showing the evaluation procedure of the second embodiment of the shaped beam evaluating method according to the present invention.
Figure 18:
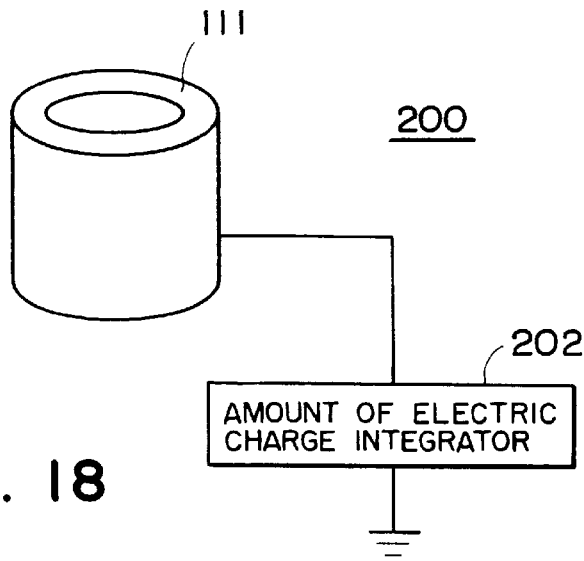
FIG. 18 is a schematic diagram showing an amount of electric charge measuring instrument.

FIG. 17 shows the evaluation procedure of the second embodiment. FIG. 18 shows an electric charge measuring device 200 used with the method of the second embodiment, in which a charge integrator 202 is connected to a Faraday cup 111. The measuring method of the offset drift rate by use of this measuring device 200 will be described hereinbelow.

In the same way as with the case of the first embodiment, in accordance with the prior art beam dimension adjusting method as disclosed in Japanese Patent Laid-open Publication No. 237526/88, first the respective sides of the first shaping aperture and the second shaping aperture are matched with respect to each other in such a way that as to become parallel to each other on reference coordinates. After that, the beam current is measured with the use of the Faraday cup by changing the beam dimension. In this case, the offset is adjusted by the beam shaping deflector by matching the aperture rotations in such a way that an increase of the beam current according to the change of the beam dimension can be expressed as a straight line, and further by extrapolating the beam current values obtained when the set beam dimension is changed on the basis of a linear function in such a way that the obtained straight line can pass through the origin. Successively, a bias value δ and the number of divisions n have been both set, as shown by steps F21 and F22 in FIG. 17. Here, the positional relationship between the first shaping aperture image and the second shaping aperture after the beam dimension has been adjusted is the same as with the case of the first embodiment shown in FIG. 3. Then, a beam of (a×b)μm² is shaped by overlapping the first shaping aperture image 103 with the second shaping aperture 105. (Measurement of short time offset drift in x direction)

Here, a beam having a size of 0.5×1 μm² on the wafer is taken into account. Further, the case where one side 0.5 μm in the x direction is divided into n (e.g., n=50) will be considered. A line beam 120 of 0.01×1 μm² on the wafer is determined by the beam shaping deflector, that is, by overlapping the first shaping aperture image 103 with the second shaping aperture 105 by use of the beam shaping deflector 106, as shown by step F23 in FIG. 17. Further, a single irradiation time t of the beam 120 is decided, and then the shooting of the beam irradiation into the Faraday cup 111 is started, as shown by step F24 in FIG. 17. Further, after the charge up has been saturated in the beam shaping deflector 106, an amount of electric charge after 50 shots is measured by Faraday cup.

Here, when a short time offset drift Δx exists in the x direction, the offset drift Δx is added to the beam 120 shaped to the (0.01×1)μm² dimension in the width direction. Therefore, when the beam dimension is actually formed, the beam 120 changes to another (0.01+Δx)×1 μm² beam 120'. In other words, the amount of electric charge after 50 shots is to be measures as a value larger than the set amount of electric charge of 0.5×1×t×J (where J denotes a current density) by 50×(Δx)×1×t×J.

Figure 19:
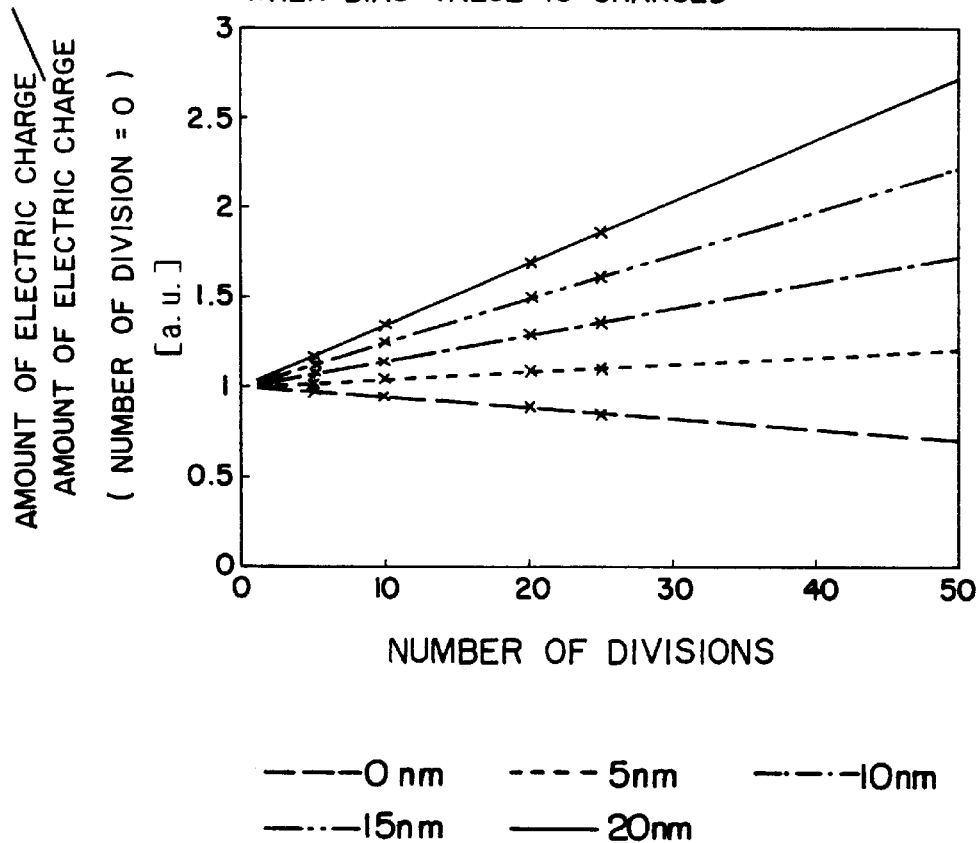
FIG. 19 is a graphical representation showing the relative relationship between the amount of electric charge and the number of division n when $\delta_x$ is used as a parameter in the charge measurement method.

Therefore, after the charge up has been saturated inside the beam shaping deflector 106, the sum total amount of electric charge obtained after the 50-time shots is measured by the charge integrator 202 by adding the bias value $\delta_x$ in the line beam width (x) direction methodically, as shown by steps F25 and F26 in FIG. 17. Further, the amount of electric charge is measured for each $\delta_x$ and n, to plot the measured amount of electric charge. In this case, when Δx and $\delta_x$ are opposite to each other in sign but equal to each other in absolute value, the measured amount of electric charge becomes equal to the set amount of electric charge 0.5×1× t×j. Further, when Δx+$\delta_x$=0, the amount of electric charge is constant without being dependent upon the number n of divisions. Therefore, a graph as shown in FIG. 19 can be obtained by measuring the amount of electric charges while changing $\delta_x$ and n, respectively, as shown by steps F27 and F28 in FIG. 17. Further, the regression lines for each $\delta_x$ point are obtained, and further the gradients of these obtained regression lines are obtained. FIG. 20 shows a graph showing the relationship between the respective bias values $\delta_x$ and the gradients of the regression lines. In FIG. 20, the bias value at which the gradient is zeroed is the offset drift. On the basis of FIG. 20, the bias value $\delta_x$ obtained in the dispersion range of the experimental system in this second embodiment is 3.1 nm. Therefore, it can be understood that there exists an offset drift of 3.1 nm in the x minus direction, as shown by step F29 in FIG. 17.

Further, in the above-mentioned second embodiment, although the offset drift has been measured by only one measurement, in order to improve the measurement precision, it is preferable to measure the offset drifts several times and to obtain an average value thereof. Further, although the amount of electric charge is measured by determining the measurement time on the basis of the number n of shots, the measurement time can be decided by multiplying the shot time by n.

(Measurement of short time offset drift in y direction)

Here, a beam having a size of 1×0.5 μm² on the wafer is taken into account. Further, the case where one side 0.5 μm in the y direction is divided into n (e.g. n=50) will be considered. A line beam 121 of 1×0.01 μm² on the wafer is determined by the beam shaping deflector, that is, by overlapping the first shaping aperture image 103 with the second shaping aperture 105 by use the beam shaping deflector 106. Further, a single irradiation time t of the beam 201 is decided, and then the shooting of the beam irradiation into the Faraday cup 111 is started. Further, after the charge up has been saturated in the beam shaping deflector 106, the amount of electric charge by 50 time shots is measured.

Here, when a short time offset drift Δy exists in the y direction, the offset drift Δy is added to the beam 121 shaped to the (1×0.01)μm² dimension in the width direction. Therefore, when the beam dimension is actually formed, the beam 121 changes to another (0.01+Δx)×1 μm² beam 121'. In other words, the amount of electric charge after 50 shots is to be measures as a value larger than the set amount of electric charge of 1×0.5×t×J (where J denotes a current density) by 1×50×(Δy)×t×J.

Figure 21:
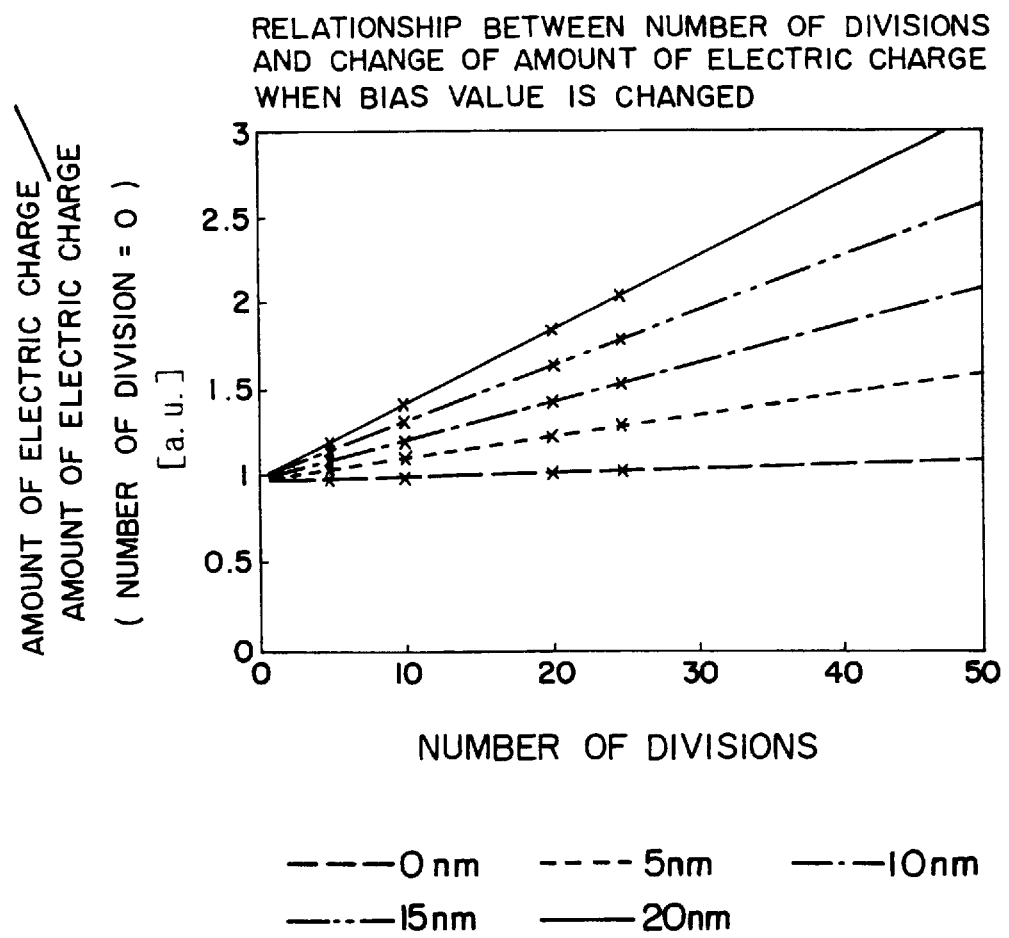
FIG. 21 is a graphical representation showing the relative relationship between the amount of electric charge and the number of division n when $\delta_y$ is used as a parameter in the charge measurement method.
Figure 22:
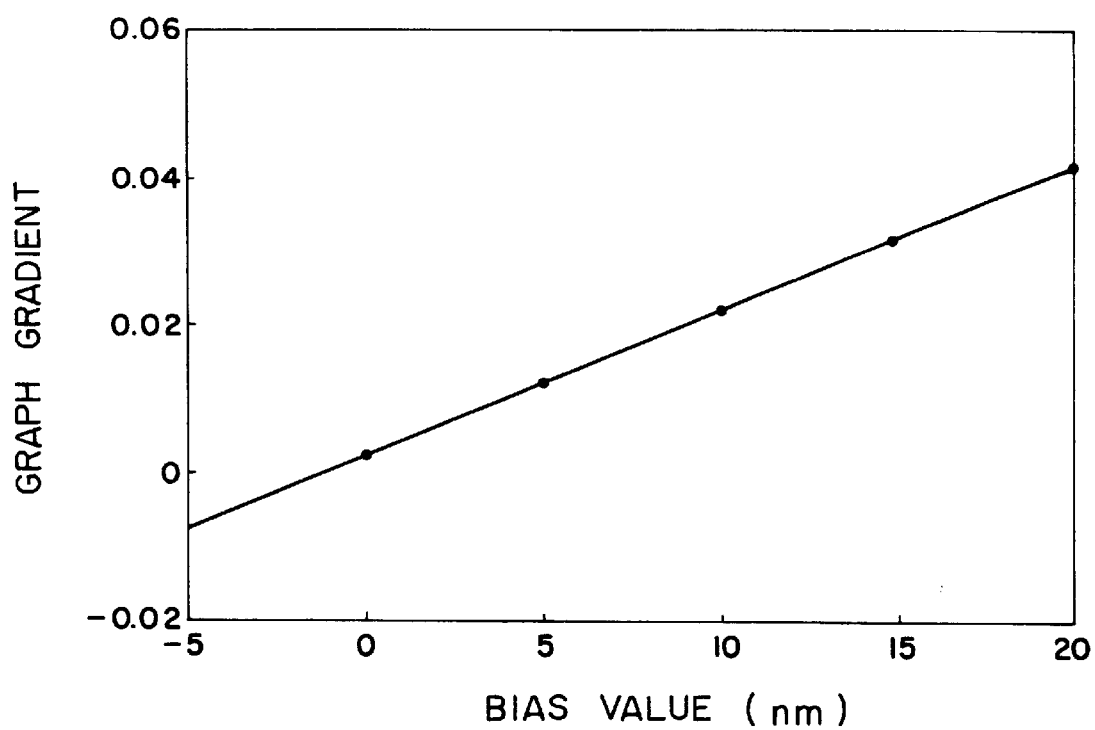
FIG. 22 is a graphical representation showing gradients (the amount of electric charge/the number of divisions) at the respective bias values $\delta_y$.

Therefore, after the charge up has been saturated inside the beam shaping deflector 106, the sum total amount of electric charge obtained after the 50-time shots is measured by the charge integrator 202 by adding the bias value $\delta_y$ in the line beam width (y) direction methodically. Further, the amount of electric charge is measured for each $\delta_y$ and the measured amount of electric charge are plotted. In this case, when Δy and $\delta_y$ are opposite to each other in sign but equal to each other in absolute value, the measured amount of electric charge becomes equal to the set amount of electric charge of the set beam of 1×0.5×t×J. Further, when Δy+$\delta_y$= 0, the amount of electric charge is constant without being dependent upon the number n of divisions. Therefore, a graph as shown in FIG. 21 can be obtained by measuring the amount of electric charge while changing $\delta_y$ and n, respectively. Further, the regression lines for each $\delta_y$ point are obtained, and further the gradients of these obtained regression lines are obtained. FIG. 22 shows a graph showing the relationship between the respective bias values $\delta_y$ and the gradients of the regression lines. On the basis of FIG. 22, the bias value $\delta_y$ obtained in the dispersion range of the experimental system in this second embodiment is −1.2 nm. Therefore, it can be understood that there exists an offset drift of 1.2 nm in the y plus direction.

Successively, the beam dimensions are adjusted under consideration of Δx and Δy. The adjustment procedure is the same as with the case of the first embodiment. Further, although the amount of electric charge is measured by determining the measurement time on the basis of the number n of shots, the measurement time can be decided by multiplying the shot time by n.

Further, in accordance with the prior art beam dimension adjustment method as disclosed in Japanese Patent Laid-open Publication No. 237526/88, first the respective sides of the first shaping aperture and the second shaping aperture are matched with respect to each other in such a way as to become parallel to each other on reference coordinates. After that, the beam current is measured with the use of the Faraday cup by changing the beam dimension. In this case, the offset is adjusted by the beam shaping deflector by matching the aperture rotations in such a way that an increase of the beam current according to the change of the beam dimension can be expressed as a straight line, and further by extrapolating the beam current value obtained when the set beam dimension is changed on the basis of a linear function in such a way that the obtained straight line can pass through the origin.

As a result, when a beam of $(A \times B) \mu m^2$ is required on the wafer, the overlap 122 between the first shaping aperture image and the second shaping aperture is adjusted so as to be $40 \times (A \times B)$, where 40 is a reciprocal number of the reduction ratio. In the above-mentioned example, however, since there exist the offset drifts in both the x and y directions, when the beam is irradiated upon the sample for a constant time or longer, the overlap 123 becomes $40 \times \{(A-\Delta x) \times (B+\Delta y)\}$. Therefore, the bias values $\delta_x$ and $\delta_y$ are previously added in the beam adjustment to cancel the offset drifts in both the x and y directions. That is, the overlap 124 is set to $40 \times \{(A+\delta_x) \times (B-\delta_y)\}$. This addition is equivalent to that the beam origin located on the lower left corner of the second shaping aperture 105 is shifted to an 0 point in FIG. 15(a). By doing this, after the beam has been irradiated upon the sample for a constant time or longer, the bias values previously determined on the basis of the offset drifts can be canceled, with the result the beam origin can be located at a position (0, 0). This correction by addition of the bias values can be achieved by use of the beam shaping deflector 106 for controlling the position of the first shaping aperture image, while checking an increase or decrease in the current rate measured by the Faraday cup mounted on the movable stage, for instance. In this second embodiment, it is possible to obtain the similar effect as with the case of the first embodiment in a shorter time, as compared with the first embodiment.

Further, in the above-mentioned second embodiment, although the sum total Value Σ of the amount of n-time irradiation electric charge has been obtained by irradiating the beam into the Faraday cup n times, it is possible to obtain the sum total value Σ of the amount of n-time irradiation electric charge by multiplying the irradiation time by n.

Further, in the above-mentioned first and second embodiments, only the short time offset drift generated after the beam is irradiated upon the sample for a constant time has been corrected. However, there exists the long time offset drift which increases gradually. Therefore, when a still higher precision is required for the pattern formation, it is necessary to update the offset drift by measuring the long time offset drift previously or during the pattern formation together with the short time offset drift. The method adopted for the long time offset drift is basically the same as with the case of the short time offset drift. When the short and long time offset drifts are both corrected, it is possible to manage the beam dimensions at an extremely high precision.

Further, it is possible to adjust the beam dimensions during the pattern formation without causing any problems. That is, it is possible to form a pattern at a high precision for a long time, by adjusting the beam dimensions at regular time intervals and by adjusting the beam dimensions under consideration of the short time offset drift rate previously obtained. In this case, however, when the beam dimension is being adjusted, since the movable stage 113 is moved to a position at which the beam is irradiated into the Faraday cup 111, a pattern cannot be formed on a sample.

Further, the method according to the present invention is not limited only to the above-mentioned embodiments. In the above-mentioned embodiments, although the method has been described on the basis of the evaluation of the resist pattern and the measurement of the amount of electric charge by the Faraday cup, it is possible to obtain the offset drift by irradiating the divided beams upon a mark written on the movable stage, and by detecting the reflected electrons generated at that time. In summary, the essential points of the present invention are that a line beam having a width equivalent to the offset drift is formed; a bias value is added to the beam in the width direction thereof methodically; and a value at which the offset drift rate can be canceled by the bias value is detected. Therefore, the method of the present invention can be applied in various ways, without being limited to the detected signal used in the method according to the present invention.

Further, in the above-mentioned embodiments, the offset drift is measured by forming a plurality of patterns in parallel to each other or by measuring the amount of electric charge by shooting a plurality of beams. This is because in the present measurement technique, it is difficult to increase the S/N ratio of measurement data obtained when the formed pattern on the wafer is exposed by only one shot. Therefore, if there exists a measurement technique of high S/N ratio, it is apparent that the evaluation method of the present invention can be attained on the basis of the formed pattern on the wafer exposed by only one shot, without causing any problems.

In the shaped beam evaluation method of the charged beam writer according to the present invention, since it is possible to detect such a small microscopic offset drift rate as to belong to a microscopic pattern range into the namometer region, the beam dimension can be adjusted and managed at a precision higher than that of the prior art method.

A few modifications of the charged beam pattern forming method according to the present invention will be described hereinbelow with reference to FIGS. 23 to 28.

Figure 25:
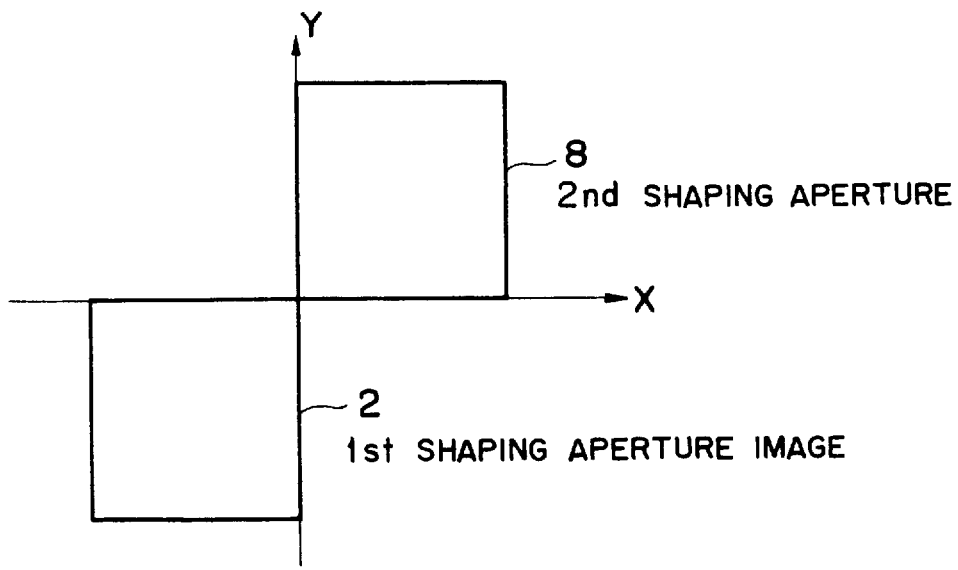
FIG. 25 is a simplified illustration showing the positional relationship between the first shaping aperture image and the second shaping aperture, obtained after the beam dimension adjustment has been completed, on condition that no beam drift exists and further the beam dimension is set to zero.

FIG. 25 shows the positional relationship between the first shaping aperture image 2 and the second shaping aperture 8 obtained when the beam dimension is set to zero on the assumption that after the beam dimension has been adjusted, there exists no short time offset drift during the pattern formation. In this case, since the beam dimension is zero, the two apertures are not overlapped with each other, so that a charged beam is not irradiated upon the sample 109 shown in FIG. 2.

However, in general, after the beam dimension has been adjusted, when a pattern formation starts, since the offset drift occurs as already explained, in spite of the fact that the beam dimension is set to zero, a beam having a size of ΔX and ΔY is generated as shown in FIG. 26. As a result, a charged beam is irradiated upon the sample. Therefore, the short time offset drifts of ΔX and ΔY are previously obtained in accordance with the shaped beam evaluation method as already explained. After that, the beam dimensions are adjusted under consideration of the these offset drifts. In more detail, when the offset drifts occur as shown in FIG. 26, the beam positions are previously shifted by −ΔX and −ΔY, as shown in FIG. 27. By doing this, since the first shaping aperture image 2 can be located at a correct position (ΔX, ΔY)=(0. 0) after the offset drifts occur as shown in FIG. 25, it is possible to obtain a target beam dimensions during the pattern formation. Further, in the above description, although the first shaping aperture image 2 is not overlapped with the second shaping aperture 8 and further the beam positions are previously shifted by −ΔX and −ΔY to facilitate understanding thereof, the beam dimensions and the beam position can be obtained by measuring the electron beam rate generated due to an overlap between the first and second shaping apertures and reaching the surface of the sample.

Figure 23:
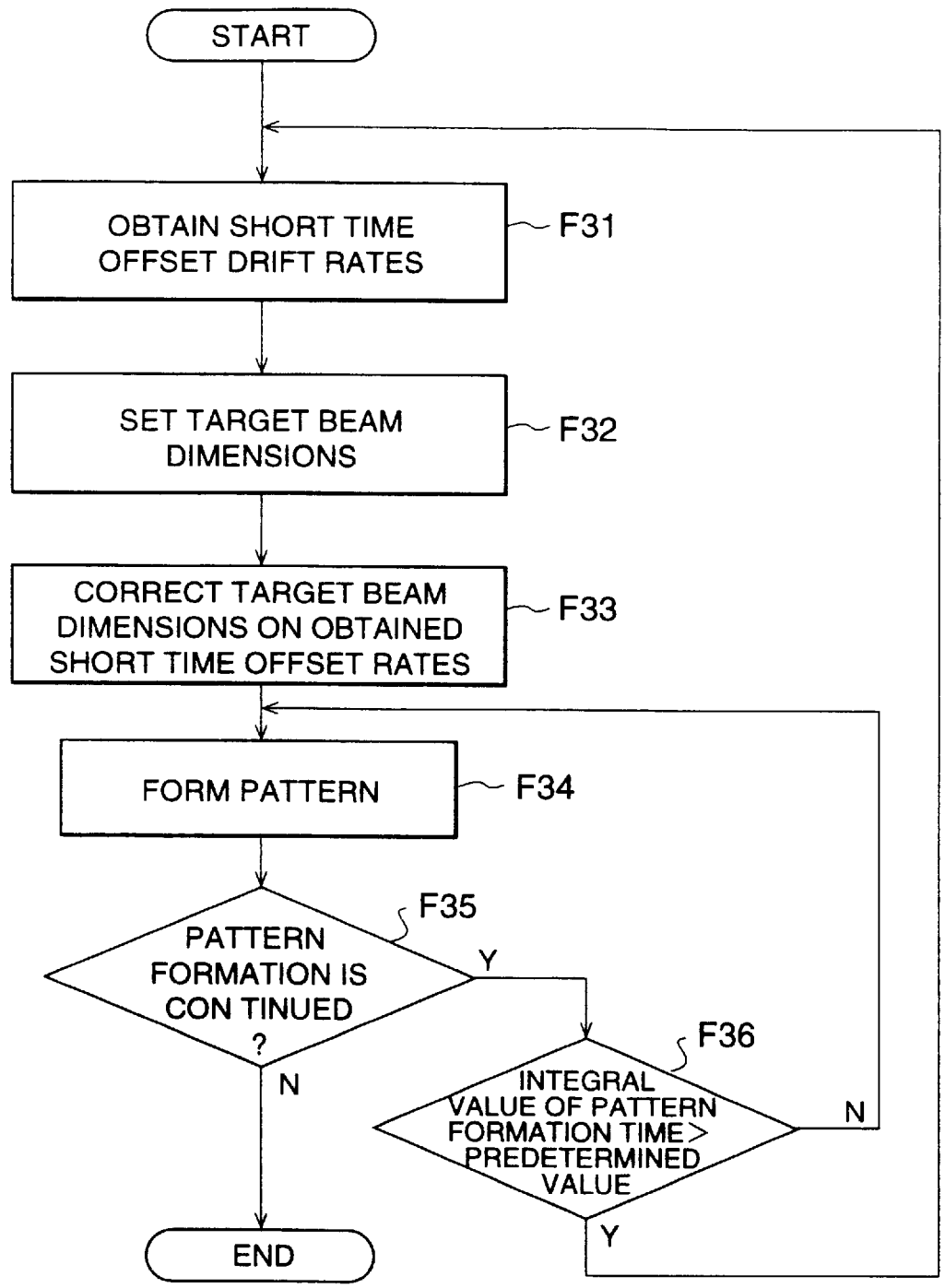
FIG. 23 is a flowchart showing a pattering procedure in accordance with the pattern forming method according to the present invention.
Figure 24:
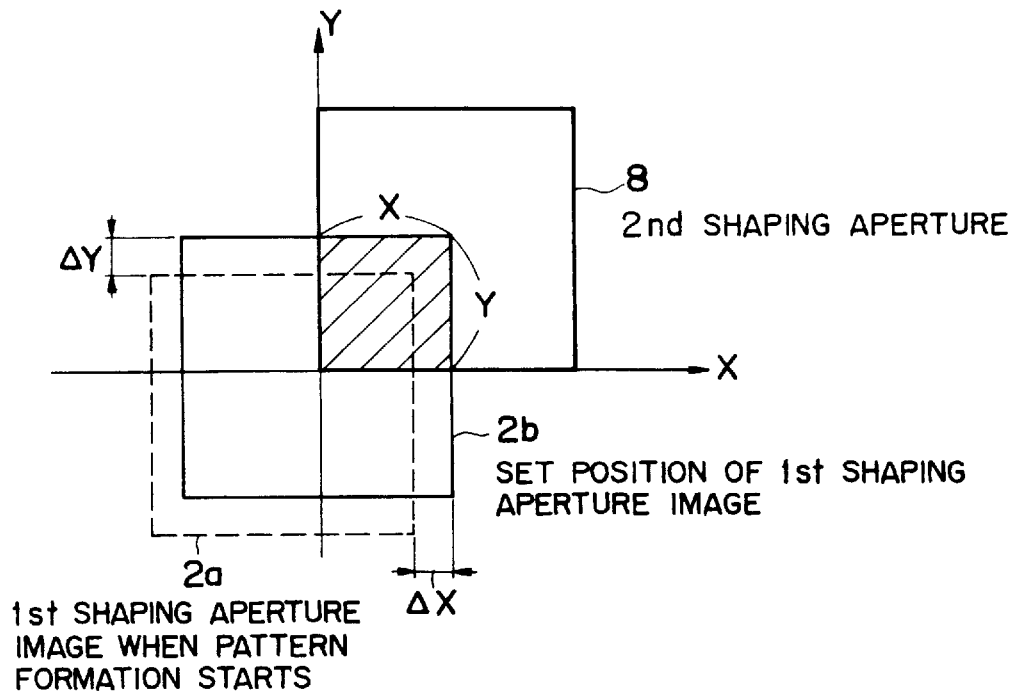
FIG. 24 is an illustration for assistance in explaining the beam dimension adjustment in accordance with the pattern forming method according to the present invention.

In practice, first the short time offset drift rates are obtained, as shown by step F31 in FIG. 23. Then, a beam of a size of X×Y is formed by overlapping the first shaping aperture with the second shaping aperture, as shown by step F32 in FIG. 23. Further, under consideration of the short time offset drift rates (ΔX, ΔY) already obtained, the beam dimensions are adjusted, as shown by step F33 in FIG. 23. In other words, the beam dimensions are decided as a size of (X−ΔX)×(Y−ΔY), as shown in FIG. 24. Here, it is possible to confirm whether the offset drift rates (ΔX, ΔY) can be corrected accurately, on the basis of an increase and/or decrease of the current rate measured on the sample surface and a sensitivity of the deflector for controlling the first shaping aperture position. After that, the pattern formation is started, as shown by step F34 in FIG. 23.

Figure 28:
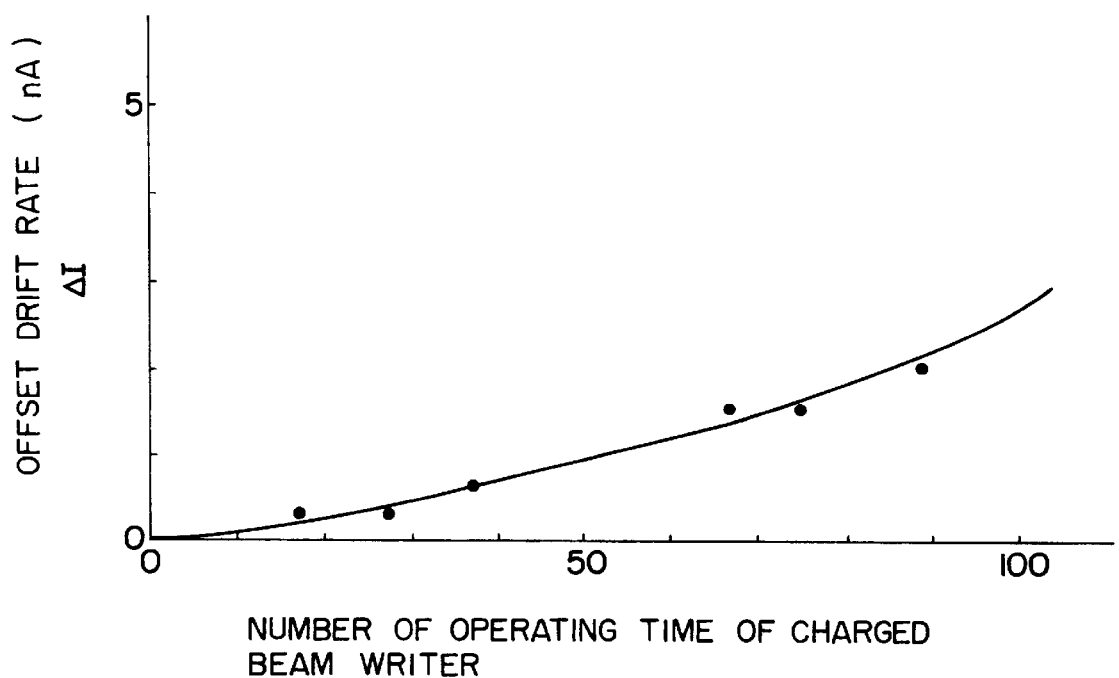
FIG. 28 is a graphical representation showing experiment results, in which the short time offset drift rate increases with increasing number of operating time of the beam writer.

By the way, the above-mentioned short time offset drift rates increase gradually with increasing operating time of the charged beam writer. FIG. 28 shows the experimental results indicating how the short time offset drift increases with increasing number of operating days. In FIG. 28, the beam dimension fluctuation rates are plotted for each three minutes after the beam irradiation upon the sample has been started. It is considered that the fluctuations increase due to the fact that carbon contamination increases gradually with the lapse of service time. However, at present electron optical system (EOS), it is impossible to suppress the carbon contamination down to zero. As understood by FIG. 28, since the short time offset drift increases gradually, it is necessary to update the correction values by measuring the offset drift rate timely, as shown by steps F35 and F36 in FIG. 23. In more detail, when an integral value of the pattern formation times is less than a predetermined value, the pattern formation is kept continued. However, when the integral value exceeds a predetermined value, the offset drift rates are obtained repeatedly for the beam adjustment. By doing this, it is possible to provide a charged beam pattern formation method which is high in both the dimension precision and reliability.

On the other hand, although gradually, since the long time offset drifts increase, when still higher precision beam dimension management is required to form a precise pattern, the long time offset drift rates must be measured, and the beam dimensions must be adjusted to other values in the same way as with the case of the short time offset drifts. By doing this, it is possible to manage the beam dimensions at an extremely high precision, so that an extremely high precise pattern can be formed.

Further, in the above-mentioned pattern forming method, the offset drift occurs due to a charge accumulated inside the beam shaping deflector. Therefore, in order to correct this offset drift, it is necessary to saturate the charge, that is, to saturate the offset drift. Therefore, it must be stated positively that it is indispensable to charge up the inside of the deflector by forming a pattern not related to an essential pattern (e.g., a dummy pattern) or a pattern of less precision even if related to the essential pattern.

As described above, in the charged beam pattern forming method according to the present invention, since the offset drift rates generated after the beam dimensions have been adjusted can be measured, and further since the beam dimensions can be adjusted by including these measured offset drift rates, it is possible to manage the actual beam dimensions correctly during pattern formation. Accordingly, an extremely high precision pattern can be formed. In addition, when the offset drift rates are measured in succession to update the drift rates for further beam adjustment, it is possible to provide a reliable pattern forming method extremely high in pattern formation precision (or dimension precision) and in reliability.

What is claimed is:

1. A method of forming a pattern by use of a charged beam, by deflecting a charged beam passed through a first shaping aperture, by shaping a variable shaped beam by controlling dimensions of the charged beam passed through a second shaping aperture, and by forming a desired pattern on a sample mounted on a movable stage, which comprises the steps of:

a step of obtaining an offset drift rate of the charged beam;

a step of setting a dimension of the charged beam at a target beam dimension;

a step of correcting the target beam dimension under consideration of the obtained offset drift rate; and a step of forming a pattern on the basis of the corrected target beam dimension, said obtaining an offset drift step comprising the steps of:

a first step of shaping a line beam by dividing into 1/n one side of a shaped beam having a dimension "a" in an x direction and a dimension "b" in a y direction perpendicular to the x direction, where n is the number of divisions;

a second step of irradiating the divided line beam upon a surface of the sample or the movable stage for a constant time or longer;

a third step of shaping a line beam by adding a bias value δ to each divided line beam width in the divided direction;

a fourth step of irradiating the shaped line beam obtained by adding the bias value to the divided line beam upon a photosensitive substance on the sample surface for a constant time for exposure;

a fifth step of repeating the fourth step exposure (n−1) times by shifting the shaped line beam obtained by adding the bias value to the divided line beam, in the direction that one side of the shaped beam is divided into 1/n, and developing the photosensitive substance, to obtain a pattern width θ;

a sixth step of repeating the above first and fifth steps by changing the number of divisions n and the bias value δ; and a seventh step of obtaining a change rate Δθ/Δn of the pattern width θ relative to the number of divisions n for each bias value δ, to obtain an offset drift rate on the basis of the obtained change rate and the bias value.

2. The method of forming a pattern by a charged beam of claim 1, wherein the pattern is formed after the charged beam has been kept irradiated upon a sample surface or a stage for mounting the sample for a constant time or longer.

3. The method of forming a pattern by a charged beam of claim 1, wherein a beam dimension correcting value obtained on the basis of the offset drift rate is updated whenever an integral value of the operation time of the charged beam writer exceeds a predetermined value.

4. The method of forming a pattern by a charged beam of claim 3, wherein the pattern is formed after the charged beam has been kept irradiated upon a sample surface or a stage for mounting the sample for a constant time or longer.

5. A method of forming a pattern by use of a charged beam, by deflecting a charged beam passed through a first shaping aperture, by shaping a variable shaped beam by controlling dimensions of the charged beam passed through a second shaping aperture, and by forming a desired pattern on a sample mounted on a movable stage, which comprises the steps of:

a step of obtaining an offset drift rate of the charged beam;

a step of setting a dimension of the charged beam at a target beam dimension;

a step of correcting the target beam dimension under consideration of the obtained offset drift rate; and a step of forming a pattern on the basis of the corrected target beam dimension;

said obtaining an offset drift step comprising the steps of:

a first step of shaping a line beam by dividing into 1/n one side of the shaped beam having a dimension "a" in an x direction and a dimension "b" in a y direction perpendicular to the x direction, where n is the number of divisions;

a second step of irradiating the divided line beam upon a surface of the sample or the movable stage for a constant time or longer;

a third step of shaping a line beam by adding a bias value $\delta$ to each divided line beam width in the divided direction;

a fourth step of repeating n times an irradiation of the line beam obtained by adding the bias value to the divided line beam into an electric charge measurement instrument for a constant time, to obtain a sum total Value $\Sigma$ of amount of n-time irradiating electric charge;

a fifth step of repeating the above first to fourth steps by changing the number of divisions n and the bias value $\delta$; and a sixth step of obtaining a change rate $\Delta\Sigma/\Delta n$ of the sum total Value $\Sigma$ of amount of the irradiation electric charge relative to the number of divisions n for each bias value $\delta$, to obtain an offset drift rate on the basis of the obtained change rate and the bias value.

6. The method of forming a pattern by a charged beam of claim 5, wherein the pattern is formed after the charged beam has been kept irradiated upon a sample surface or a stage for mounting the sample for a constant time or longer.

7. The method of forming a pattern by a charged beam of claim 5, wherein the beam dimension correcting value obtained on the basis of the offset drift rate is updated whenever an integral value of the operation time of the charged beam writer exceeds a predetermined value.

8. The method of forming a pattern by a charged beam of claim 7, wherein the pattern is formed after the charged beam has been kept irradiated upon a sample surface or a storage for mounting the sample for a constant time or longer.

* * * * *